United States Patent [19]

Watanabe et al.

[11] Patent Number: 5,625,526
[45] Date of Patent: Apr. 29, 1997

[54] ELECTROSTATIC CHUCK

[75] Inventors: Masahide Watanabe; Masami Kubota, both of Yamanashi-ken; Shiro Koyama, Tokyo; Kenji Ishikawa, Sagamihara; Kouichi Kazama, Yamanashi-ken; Mitsuaki Komino, Tokyo; Takanori Sakurai, Yokohama, all of Japan

[73] Assignees: Tokyo Electron Limited, Tokyo; Tokyo Electron Yamanashi Limited, Nirasaki, both of Japan

[21] Appl. No.: 252,213

[22] Filed: Jun. 1, 1994

[30] Foreign Application Priority Data

| Jun. 1, 1993 | [JP] | Japan | 5-156284 |
| Jun. 4, 1993 | [JP] | Japan | 5-160375 |
| Jun. 24, 1993 | [JP] | Japan | 5-177360 |
| Jun. 28, 1993 | [JP] | Japan | 5-181869 |
| Jun. 28, 1993 | [JP] | Japan | 5-181870 |
| Sep. 9, 1993 | [JP] | Japan | 5-249923 |
| Dec. 8, 1993 | [JP] | Japan | 5-340795 |

[51] Int. Cl.$^6$ .................................................. H02N 13/00
[52] U.S. Cl. .......................................................... 361/234
[58] Field of Search ............................... 361/234; 279/128

[56] References Cited

U.S. PATENT DOCUMENTS

| 4,771,730 | 9/1988 | Tezuka | 156/345 X |
| 4,897,171 | 1/1990 | Ohmi | 156/345 X |
| 5,151,845 | 9/1992 | Watanabe et al. | 361/234 |
| 5,155,652 | 10/1992 | Logan et al. | 361/234 |
| 5,191,506 | 3/1993 | Logan et al. | 361/234 |
| 5,207,437 | 5/1993 | Barnes et al. | 361/234 |
| 5,250,137 | 10/1993 | Arami et al. | 156/345 |
| 5,255,153 | 10/1993 | Nozawa et al. | 361/234 |
| 5,311,452 | 5/1994 | Yokota et al. | 156/345 X |
| 5,348,497 | 9/1994 | Nitescu | 439/824 |
| 5,350,479 | 9/1994 | Collins et al. | 156/345 |
| 5,384,681 | 1/1995 | Kitabayashi | 361/234 |
| 5,463,526 | 10/1995 | Mundt | 361/234 |

OTHER PUBLICATIONS

Larry D. Hartsough, "Electrostatic Wafer Holding", Solding State Technology, Jan. 1993, pp. 87–90.
C. Balakrishnan, "Johnsen–Rahbek Effect with an Electronic Semi–Conductor", British Journal of Applied Physics, pp. 211–213 Aug. 1950.
Alfred Johnsen & Knud Rahbek, "A Physical Phenomenon and Its Applications to Telegraphy, Telephony, etc.", I.E.E. Journal, vol. 61, Jul. 1923, pp. 713–725.

Primary Examiner—Fritz Fleming
Attorney, Agent, or Firm—Oblon, Spivak, McClelland, Maier & Neustadt, P.C.

[57] ABSTRACT

An electrostatic chuck of this invention includes a conductive film, an insulating coat formed on a susceptor to cover the conductive film, and a feeder circuit for applying a voltage to the conductive film to cause the insulating coat to generate an electrostatic attractive force. The feeder circuit includes a connecting conductor replacing a portion of the insulating coat to be electrically connected to the conductive film, a first feeder pin extending through the susceptor from its front surface side to its rear surface side and having one end portion electrically connected to the connecting conductor, an insulating member for insulating the first feeder pin from the susceptor, a second feeder pin having one end portion pressed against the other end portion of the first feeder pin to be electrically connected to the first feeder pin, and a power supply electrically connected to the second feeder pin.

9 Claims, 21 Drawing Sheets

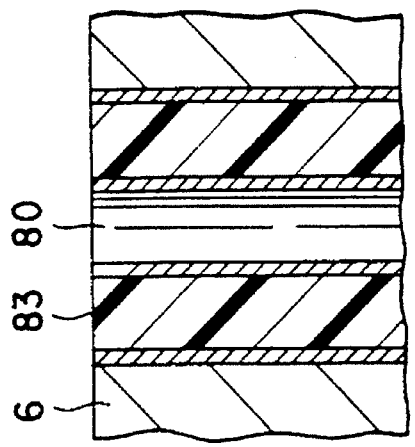
F I G. 5c
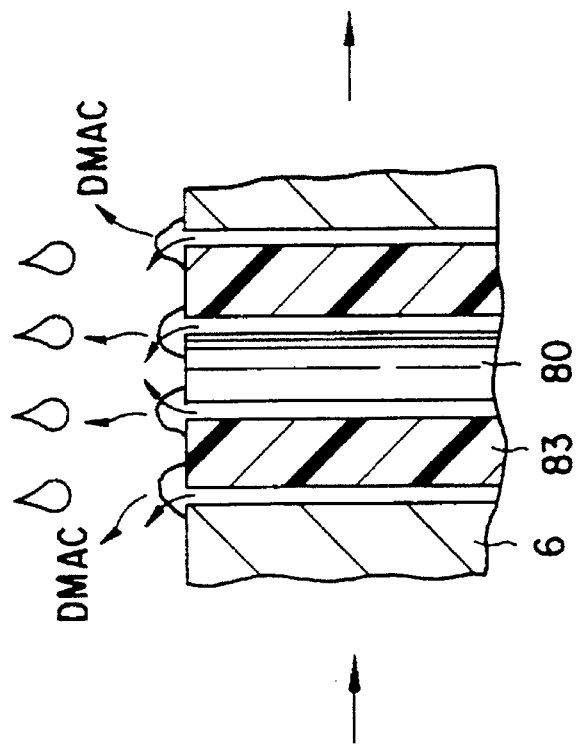
F I G. 5b
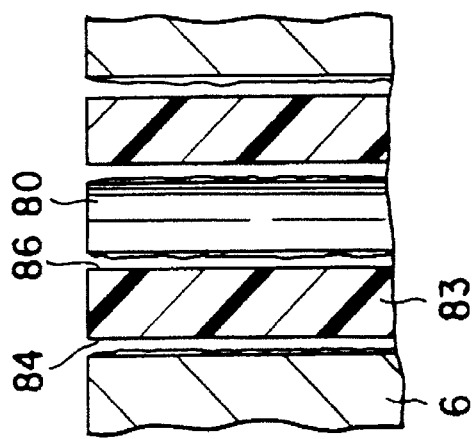
F I G. 5a

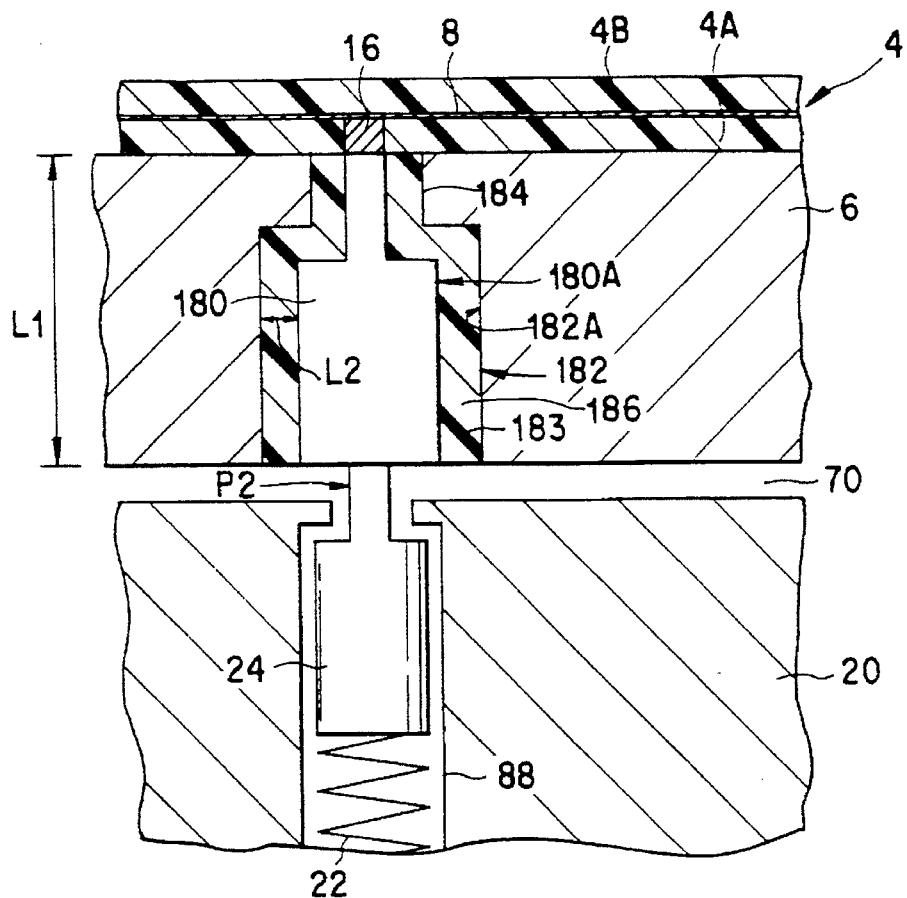
F I G. 6
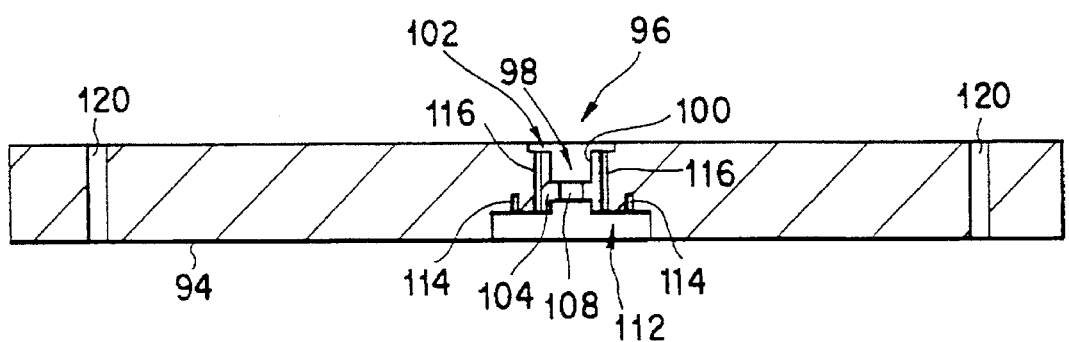
F I G. 7

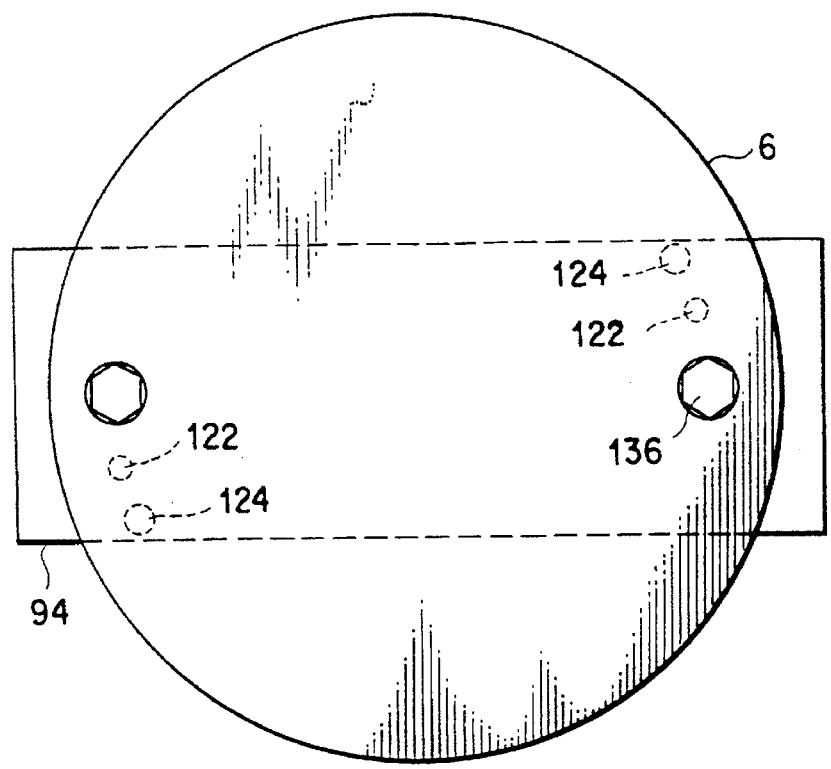
F I G. 12
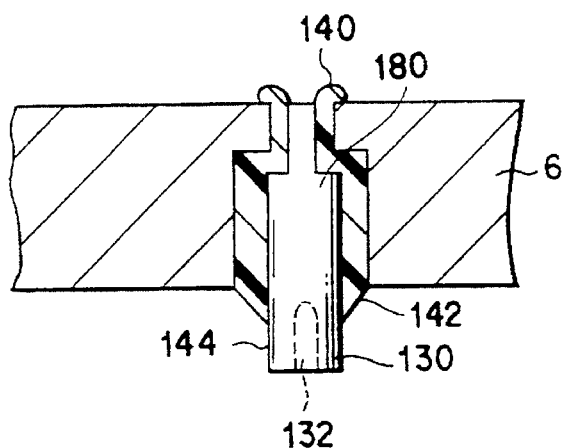
F I G. 13
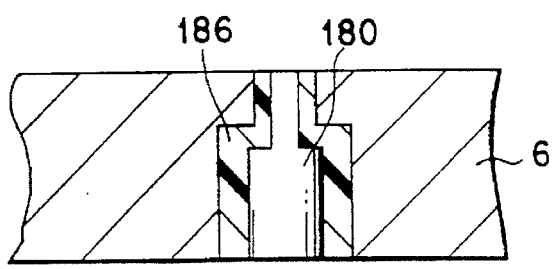
F I G. 14

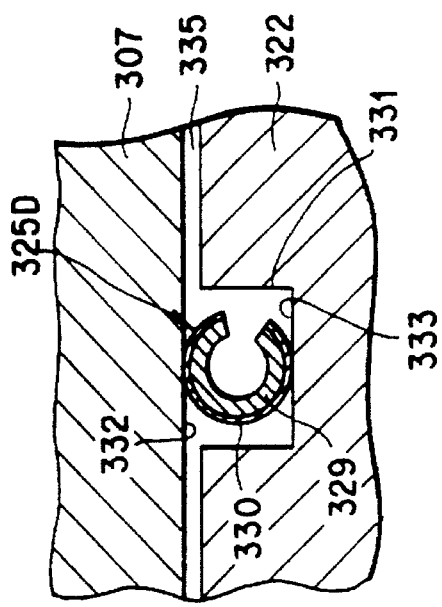
FIG. 23
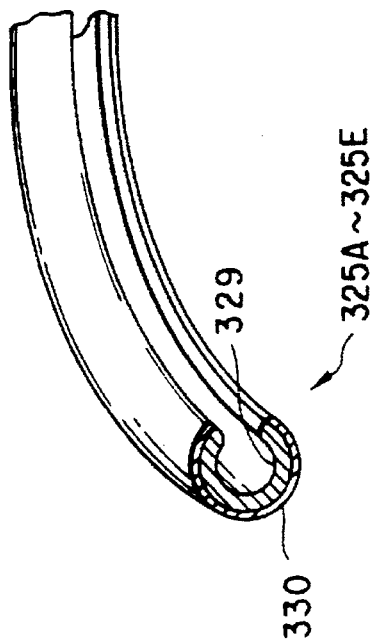
FIG. 22
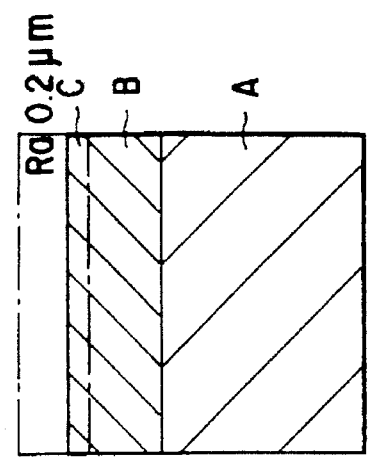
FIG. 24c
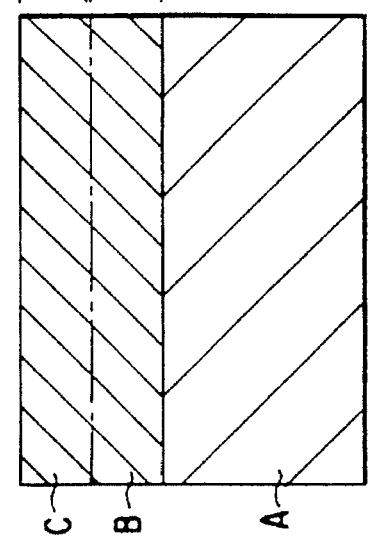
FIG. 24b
FIG. 24a

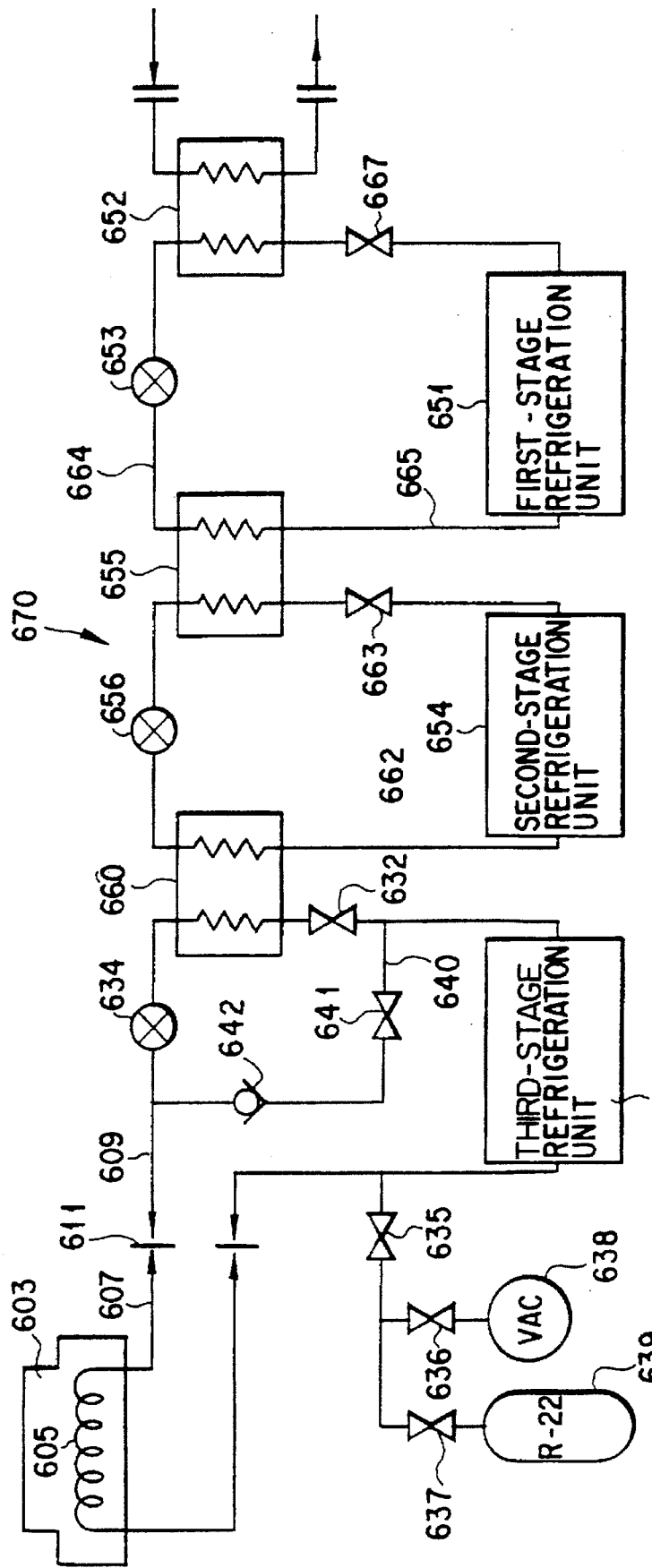
F I G. 37

ELECTROSTATIC CHUCK

BACKGROUND OF THE INVENTION

1. Field of the Invention

The present invention relates to an electrostatic chuck (to be referred to as an ESC hereinafter) used to chuck a substrate and a method of manufacturing the same.

2. Description of the Related Art

As shown in FIG. 1, in a conventional ESC, a conductive film 8 is buried in a polyimide resin sheet 4, and a DC power supply (not shown) is connected to the conductive film 8 via a connecting conductor 16, a feeder sheet 14, a connecting conductor 18, and a feeder pin 24. The sheet 4 is bonded to the upper surface of an aluminum susceptor 6. A feeder film 12 is buried in the feeder sheet 14. The feeder film 12 and the conductive film 8 are electrically connected to each other via the connecting conductor 16. The feeder film 12 and the feeder pin 24 are electrically connected to each other via the connecting conductor 18. Each of these connecting conductors 16 and 18 is formed by baking a conductive paste. An end portion of the feeder pin 24 is pressed against the connecting conductor 18 by a spring 22.

The susceptor 6 is constituted by a combination of several members. The susceptor members are designed to be separable to allow easy replacement of the sheet 4. That is, the end faces of the susceptor members are separated from each other, with a clearance 10 having a width of about 1 mm being provided therebetween.

If the atmosphere at the contact portion between the feeder pin 24 and the connecting conductor 18 is set in a vacuum or low-pressure state, a discharge may occur. In order to prevent this, a gas with a pressure near the atmospheric pressure is sealed in a space 70.

The processing temperature for a semiconductor wafer varies from a low temperature of −150° to a high temperature of about +100° depending on the type of process to be performed. The low or high temperature source is supplied from the susceptor base 20 side. In order to improve the heat transfer efficiency, a heat transfer gas (helium gas) at the atmospheric pressure or a pressure of about 10 Torr is introduced between the susceptor base 20 and the susceptor 6. In addition, this helium gas is introduced to the interface between the sheet 4 and a wafer W and to the interface between the susceptor 6 and the susceptor base 20, thus acting to improve the heat transfer efficiencies therebetween.

The sheet 4, however, partly expands upward to form a projection 28 under the influence of a pressure difference $P_1$ between the process chamber side (almost vacuum) and the clearance 10 side (almost 1 atm).

In general, in order to allow the ESC to fully exhibit its function, the flatness of the sheet surface must be ensured to a certain degree or more to ensure a good contact with respect to a wafer. However, a height $H_1$ of the above projection 28 is larger than a limit value, e.g., 23 µm, beyond which a good contact cannot be maintained. Consequently, the ESC cannot fully exhibit its function.

In addition, when the temperature of the susceptor 6 is changed in accordance with the type of process to be performed, a portion of the sheet 4 is separated from the susceptor 6 because of the difference in thermal expansion therebetween. As a result, the helium gas leaks to result in an unstable process. Furthermore, the sheet 4 is degraded due to thermal deformation, leading to insufficient insulation. Such problems of gas leakage, a degradation in the withstand voltage characteristics or a dielectric breakdown of an insulating member, and the like are posed when a low-temperature etching process is performed with respect to a wafer to form a microscopic pattern on the order of half microns and quarter half microns.

SUMMARY OF THE INVENTION

It is an object of the present invention to provide an ESC in which airtightness between an insulating member and susceptor members or a feeder pin is ensured, and no degradation in the withstand voltage characteristics of the insulating member occurs and hence no dielectric breakdown of the insulating member is caused even when a high voltage is applied thereto, thereby ensuring high durability and a long service life, and a method of manufacturing the same.

It is another object of the present invention to provide, in a more general sense, an ESC in which an aluminum member is airtightly joined to an electrically insulating member, and the airtightness is not impaired even with repetitive changes in temperature from low temperatures to high temperatures.

According to an aspect of the present invention, there is provided an electrostatic chuck comprising:

a conductive film;

an insulating coat formed on a susceptor to cover the conductive film; and a feeder circuit for applying a voltage to the conductive film to cause the insulating coat to generate an electrostatic attractive force, the feeder circuit including a connecting conductor replacing a portion of the insulating coat to be electrically connected to the conductive film, a first feeder pin extending through the susceptor from a front surface side to a rear surface side thereof and having one end portion electrically connected to the connecting conductor, an insulating member for insulating the first feeder pin from the susceptor, a second feeder pin having one end portion pressed against the other end portion of the first feeder pin to be electrically connected to the first feeder pin, and a power supply electrically connected to the second feeder pin.

According to an aspect of the present invention, there is provided an electrostatic chuck used in an atmosphere in which an object to be processed is subjected to a plasma process, comprising:

a conductive film;

a semiconductor coat consisting of a ceramic material and formed on a susceptor to cover the conductive film; and a feeder circuit for supplying a current to the conductive film to supply a weak current to the object via the semiconductor coat, the feeder circuit including a DC power supply electrically connected to the conductive film, and control means for controlling the DC power supply to supply a constant current to the conductive film.

As the conductive film, an Ag-Pd calcined sheet (foil) or a tungsten sheet (foil) is preferably used. As the semiconductor coat, an SiC sheet or a $Al_2O_3$ sheet is preferably used. Note that a ceramic sheet formed by adding titanium oxide in an $Al_2O_3$ base ceramic material may be used as the semiconductor coat. In addition, an SiC sheet or a polyimide resin sheet is preferably inserted, as an intermediate coat, between an electrostatic chucking conductive film and a plasma generating electrode.

The semiconductor coat preferably has a resistivity of $10^3$ to $10^{12}$ Ω·cm, most preferably 108 to $10^{10}$ Ω·cm.

The semiconductor coat preferably has a thickness of 150 to 500 μm, most preferably 200 to 300 μm.

Note that the susceptor is an aluminum member having one surface (in contact with the insulating coat) anodized and polished until a centerline average roughness Ra reaches 0.1a to 0.5a.

It is preferable that polybenzimidazole be poly-2,2'-(m-phenylene)-5,5'-bibenzimidazole.

Although the molecular weight of polybenzimidazole is not specifically limited, polybenzimidazole having a number-average molecular weight of 2,000 to 100,000 is preferably used.

As a solvent for preparing a polybenzimidazole solution, a polar solvent like the one generally used to prepare a polybenzimidazole dry spinning liquid can be used. Preferably, the solvent is one selected from the group consisting of N,N-dimethylacetamide, N,N-dimethylformamide, dimethylsulfoxide, and N-methyl-2-pyrrolidone. More preferably, N,N-dimethylacetamide having a boiling point of 167° is used.

Furthermore, in the present invention, the drying efficiency of polybenzimidazole can be improved without degrading the solubility of the solvent by adding a solvent mixture of a terpene such as kerosene and a ketone such as methyl ethyl ketone in the solvent.

According to an aspect of the present invention, there is provided a method of manufacturing an electrostatic chuck having a feeder circuit formed to apply a voltage to a conductive film covered with an insulating coat, comprising the steps of:

immersing a joint surface of an aluminum member in a polybenzimidazole solution;

joining the aluminum member to a polybenzimidazole member;

holding a joint surface between the members in a vertical direction; and hardening the polybenzimidazole solution by heating to a temperature not less than a boiling point of a solvent while dropping the solvent onto an upper end portion of a small space formed in the joint surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 contains partial sectional views for explaining the procedure for mounting a feeder pin in the electrostatic chuck;

FIG. 6 is a partial sectional view showing an electrostatic chuck according to the second embodiment of the present invention;

FIG. 7 is a partial sectional view showing the electrode structure of the electrostatic chuck;

FIG. 12 is a plan view of the assembly of the assembly jig body and the susceptor;

FIG. 13 is a partial sectional view showing the feeder auxiliary pin fixed to the susceptor;

FIG. 14 is a partial sectional view showing the prototype for a feeder auxiliary pin from which unnecessary portions are removed;

FIG. 22 is a perspective view showing a portion of a seal member;

FIG. 23 is a sectional view showing a seal structure incorporating the seal member;

FIG. 24 contains views for explaining the procedure for manufacturing a sealed surface structure;

FIG. 37 is a block sectional view showing an electrostatic chuck having a cooling means according to still another embodiment.

DETAILED DESCRIPTION OF THE PREFERRED EMBODIMENTS

Various embodiments in which electrostatic chucks according to the present invention are applied to plasma etching apparatuses will be described in detail below with reference to the accompanying drawings.

Figure 2:
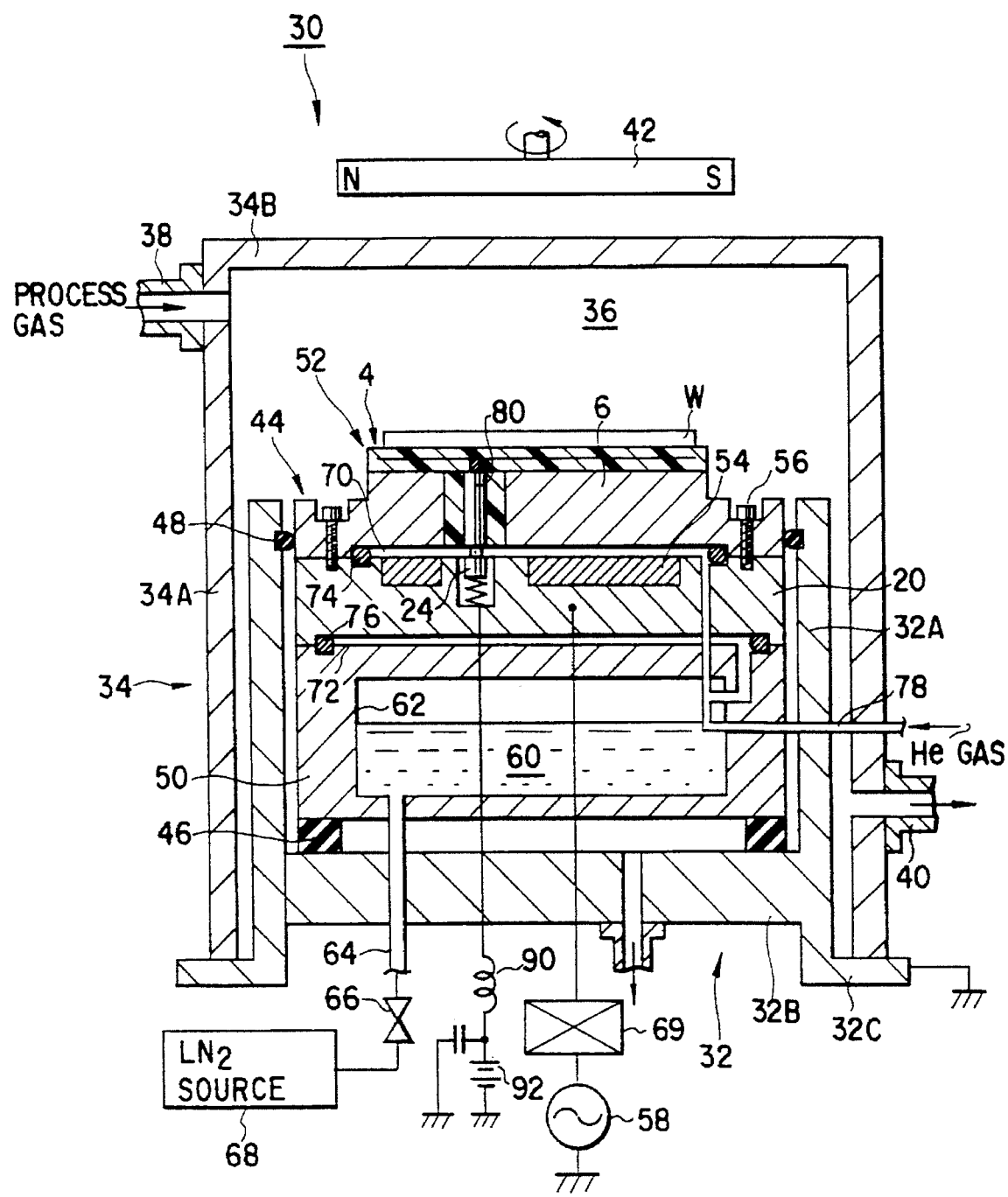
FIG. 2 is a block sectional view showing a plasma etching apparatus having an electrostatic chuck (composed of a polyimide) according to the first embodiment of the present invention.

As shown in FIG. 2, a plasma etching apparatus 30 includes a process chamber 36 constituted by inner and outer frames 32 and 34, each consisting of aluminum or the like. The inner frame 32 is constituted by a cylindrical wall portion 32A, a bottom portion 32B formed at a position slight above the lower end of the cylindrical wall portion 32A to form a space under the bottom portion 32B, and an outer flange portion 32C formed around the lower end of the cylindrical wall portion 32A. The outer frame 34 is constituted by a cylindrical wall portion 34A and a ceiling portion 34B. The outer frame 34 is placed on the outer flange portion 32C to airtightly cover the inner frame 32.

A gas supply pipe network 38 is formed at an upper portion of the cylindrical wall portion 34A to introduce an HF gas from a process gas source (not shown) into the process chamber 36. An exhaust pipe network 40 is formed at a lower portion of the cylindrical wall portion 34A to evacuate the process chamber 36 by using a vacuum pump (not shown).

A permanent magnet 42 as a magnetic field generator for forming a horizontal magnetic field on the surface of a wafer W is rotatably arranged above the ceiling portion 34B. A magnetron discharge is caused by forming a horizontal magnetic field formed by the permanent magnet 42 and an electric field perpendicular to this horizontal magnetic field.

A susceptor assembly 44 is arranged in the process chamber 36. The susceptor assembly 44 is supported on the bottom portion 32B of the inner frame 32 via a plurality of insulating members 46. An O-ring 48 as an insulating seal member is disposed between the side surface of the susceptor assembly 44 and the cylindrical wall portion 32A.

The susceptor assembly 44 has a three-layered structure constituted by a susceptor 6, a susceptor base 20, and a cooling jacket housing base 50. A sheet 4 is bonded to the upper surface of the susceptor 6 with a thermosetting adhesive. An electrostatic chuck 52 is constituted by these components. The wafer W is chucked and held with the coulomb force generated by the electrostatic chuck 52.

A heater 54 for adjusting the temperature of the wafer W is provided for the susceptor base 20. The heater 54 is connected to a heater controller (not shown) so that temperature control is performed in accordance with a signal from a temperature sensor (not shown) for monitoring the temperature of the susceptor 6.

The susceptor 6 is detachably fixed to the susceptor base 20 with a plurality of bolts 56. That is, the susceptor 6 can be removed from the susceptor base 20 connected to an RF power supply 58. Note that the heater 54 is disposed on the susceptor base 20.

A cooling jacket 62 for storing liquid nitrogen 60 as a refrigerant is arranged in the cooling jacket housing base 50. The cooling jacket 62 communicates with a liquid nitrogen source 68 via a pipe 64 and a valve 66. A liquid level monitor (not shown) is arranged in the cooling jacket 62. The amount of liquid nitrogen supplied to the cooling jacket 62 is controlled in accordance with a signal from the liquid level monitor.

The susceptor assembly 44 having the above arrangement is insulated from the inner and outer frames 32 and 34 by the insulating members 46 and the O-ring 48, thus constituting a cathode coupling having one polarity electrically. The RF power supply 58 is connected to the susceptor base 20 via a matching unit 69. With this structure, a plasma generating electrode is constituted by the susceptor assembly 44 and the ceiling portion 34B of the grounded outer frame 34.

A space 70 is defined between the susceptor 6 and the susceptor base 20, and a space 72 is defined between the susceptor base 20 and the cooling jacket housing base 50. These spaces 70 and 72 are isolated/shielded from a process atmosphere by O-rings 74 and 76. A 1-atm helium gas (or argon gas) may be supplied via a gas supply pipe network 78. Each of the spaces 70 and 72 has a width of 1 to 100 μm, preferably about 50 μm.

Figure 3:
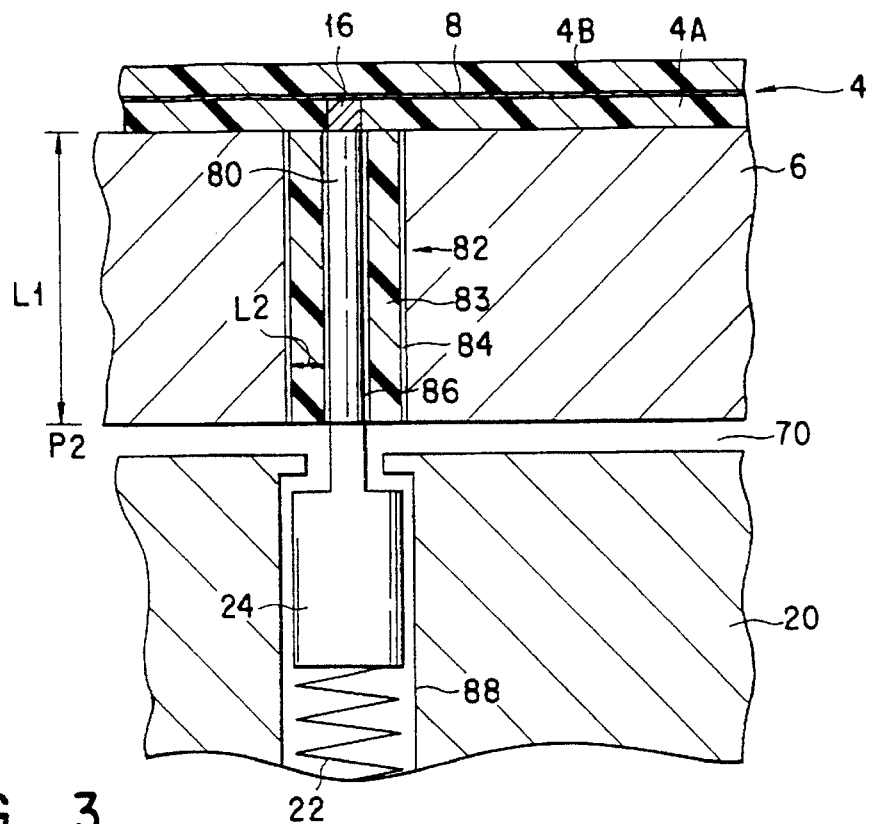
FIG. 3 is a partial sectional view showing the electrostatic chuck of the first embodiment.

The ESC of the first embodiment will be describe next with reference to FIG. 3.

The ESC sheet 4 is obtained by inserting a conductive film 8 between a pair of polyimide resin films 4A and 4B and bonding them together. The conductive film 8 is composed of a copper foil, a silver foil, or the like. A first feeder pin 80 is held by the susceptor 6 via an insulating member 83. A second feeder pin (contactor) 24 is held by the susceptor base 20. The second feeder pin 24 is pressed against the first feeder pin 80 by a spring 22. With this structure, the upper and lower ends of the first feeder pin 80 are respectively in contact with a connecting conductor 16 of the sheet 4 and the second feeder pin 24. The first feeder pin 80 is electrically connected to the conductive film 8 via the connecting conductor 16. Note that the second feeder pin 24 is connected to a DC power supply 92.

The susceptor 6 consists of aluminum. A thickness $L_1$ of the susceptor 6 is about 20 mm. A feeder hole 82 is formed to extend through the susceptor 6 in the direction of thickness. The wafer insulating member 83 consisting of polybenzimidazole is filled in a first space 84 in the feeder hole 82, whereas the feeder pin 80 consisting of aluminum is inserted in a second space 86.

A thickness $L_2$ of the insulating member 83 is set to be a value ensuring a distance enough to hold sufficient insulation with respect to a high DC voltage for electrostatic chucking, e.g., at least 1.0 mm or more. Each of the first and second spaces 84 and 86 is set to be 0.1 mm or less, preferably 0.02 mm or less. With the first and second spaces 84 and 86 having such a thickness, in the manufacturing process to be described later, the aluminum member 80 and the polybenzimidazole member 83 can be accurately positioned and can be held in a vertical state without interfering with permeation of the polybenzimidazole solution through the spaces, thereby forming an airtight polybenzimidazole layer.

Note that polybenzimidazole forming the insulating member 83 is preferably poly-2,2'-(m-phenylene)-5,5'-bibenzimidazole having the following structural formula. Although the molecular weight of this polybenzimidazole is not specifically limited, for example, polybenzimidazole having a number-average molecular weight of 2,000 to 100,000 is preferably used.

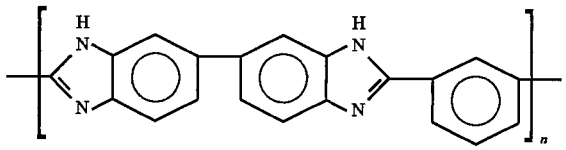

It is known that this polybenzimidazole has a high affinity for an aluminum member, which is joined in an electrically insulated state, regardless of changes in temperature, because it exhibits stable quality characteristics in the temperature range from an ultra-low temperature of about −150° C. to room temperature or more, especially its linear thermal coefficient of expansion being $23.6 \times 10^{-6}/°C$. which is almost equal to that of aluminum.

Figure 4:
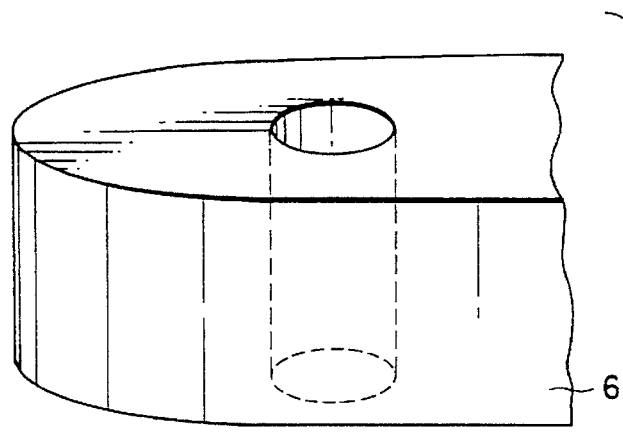
FIG. 4 is an exploded perspective view showing electrical connecting members of the electrostatic chuck.
Figure 4:
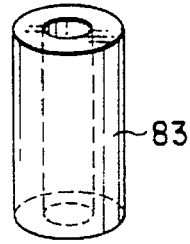
Figure 4:
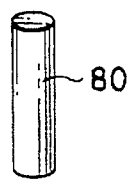

A method of mounting the feeder pin in the ESC of the first embodiment will be described next with reference to FIGS. 4, and 5.

First of all, the first feeder pin 80 is immersed in the polybenzimidazole solution, and the polybenzimidazole is coated on the inner wall surface of the feeder hole 82 of the susceptor 6. With this process, as shown at (a) in FIG. 5, a thick film of the polybenzimidazole solution is formed on the contact surface with respect to the insulating member 83. As a result, insertion of the feeder pin 80 into the second space 86 of the insulating member 83, and insertion of the insulating member 83 into the first space 84 of the susceptor 6 can be smoothly performed. In addition, the affinity of the aluminum members 6 and 80 for the polybenzimidazole member 83 is improved. As a result, an airtight polybenzimidazole layer can be formed on the joint portions.

As a solvent for preparing a polybenzimidazole solution, a polar solvent like the one generally used to form a polybenzimidazole dry spinning liquid can be used. Preferably, the solvent is one selected from the group consisting of N,N-dimethylacetamide, N,N-dimethylformamide, dimethylsulfoxide, and N-methyl-2-pyrrolidone. More preferably, N,N-dimethylacetamide having a boiling point of 167° is used. Furthermore, the drying efficiency of polybenzimidazole can be improved without degrading the solubility of the solvent by adding a solvent mixture of a terpene such as kerosene and a ketone such as methyl ethyl ketone in the solvent.

Subsequently, as shown at (a) in FIG. 5, the susceptor 6 in which the feeder pin 80 and the insulating member 83 are fitted is placed in a furnace while the joint surface is held in a substantially vertical state. As shown at (b) in FIG. 5, the temperature in the furnace is then gradually increased from room temperature to about 150° C. to 220° C. while the polybenzimidazole solution is dropped onto the upper ends of the first and second spaces 84 and 86. Note that the final temperature depends on the boiling point of a solvent used for dissolving polybenzimidazole. If, for example, a solution obtained by dissolving polybenzimidazole in N,N-dimethylacetamide (DMAC) is used, N,N-dimethylformamide can be volatilized to cross-link the polybenzimidazole by heating the solution up to 167° C. or more, preferably about 180° C. The heating rate is generally set to be 20° C./min or less, preferably 15° C./min to 20° C./min. This heating rate depends on distances $L_1$ and $L_2$ of the first and second spaces 84 and 86, i.e., the thickness of the polybenzimidazole layer.

In order to form a uniform and strong polybenzimidazole layer, the viscosity of the solvent is preferably at a proper value in heating/drying the polybenzimidazole solution, and the solvent is preferably volatilized/dried as quickly as possible without forming any air bubbles. For this purpose, the susceptor 6, the insulating member 83, the first feeder pin 80, and the polybenzimidazole solution are preferably preheated to 50° to 100° C., more preferably 60° to 70° C.

In this manner, the feeder circuit assembly is dried/heated in the furnace while the polybenzimidazole solution is dropped onto the upper ends of the first and second spaces 84 and 86. With this process, the dropped polybenzimidazole solution permeates through the first and second spaces 84 and 86, and N,N-dimethylacetamide in the solution gradually evaporates. As a result, the polybenzimidazole solution is dried/hardened to form polybenzimidazole layers between the first and second spaces 84 and 86. After the polybenzimidazole solution stops permeating through the first and second spaces 84 and 86, the solution is kept at 180° C. or more for one hour. As shown at (c) in FIG. 5, upon thermal condensation and cross-linking of the polybenzimidazole, more uniform and stronger polybenzimidazole layers are formed in the first and second spaces 84 and 86.

The polybenzimidazole layers formed in the above-described manner are integrated with the polybenzimidazole insulating member 83 molded in advance, and are tightly joined to the aluminum members 6 and 80. The linear thermal coefficient of expansion of polybenzimidazole is almost equal to that of aluminum, and no destruction occurs at the joint portions. Therefore, the electrostatic chuck can be stably operated without any failure for a long period of time.

After the insulating member 83 and the feeder pin 80 are mounted in the susceptor 6 in this manner, the upper and lower end portions of these members are polished to be substantially flush with those of the upper and lower surfaces of the susceptor 6, thereby completing a feeder circuit for the electrostatic chuck.

As shown in FIG. 3, a portion of a resin film 4A of the ESC sheet 4 is removed to form a circular hole having a diameter of about 2 mm and reaching the conductive film 8. A silver conductive paste is then filled in this hole and baked to form the connecting conductor 16. The feeder pin 80 and the conductive film 8 are electrically connected to each other via this connecting conductor 16. The distal end of the feeder contact 24 is in contact with the bottom portion of the feeder pin 80. The feeder contact 24 is biased upward, i.e., toward the susceptor 6, by an elastic member 22 such as a spring in a pin hole 88 formed in the susceptor base 20 located below the feeder pin 80. With this structure, the feeder contact 24 is electrically connected to the feeder pin 80.

As shown in FIG. 2, the feeder contact 24 is connected to the DC power supply 92 via a conductive line 90 and is designed to apply a DC voltage of, e.g., 0.2 kV to the conductive film 8 of the ESC sheet 4.

The ESC sheet 4 is firmly joined to the mount surface of the susceptor 6 with, for example, an epoxy-based adhesive. In addition, as described above, a helium gas of almost 1 atm is introduced in the space 70 defined between the lower surface of the susceptor 6 and the upper surface of the susceptor base 20 to improve the heat transfer efficiency of this portion and suppress a discharge at a feeder point P2 of the feeder pin 24.

The overall operation of the etching apparatus having the above arrangement will be described next.

To begin with, the wafer W is loaded in the process chamber 36 and placed on the electrostatic chuck 52 by a convey arm (not shown). A DC voltage of 2.0 kv is kept applied to the conductive film 8 of the electrostatic chuck. Consequently, the wafer W is chucked onto the sheet 4 with a coulomb force. The process chamber 36 is evacuated to a vacuum in advance, and an HF gas is introduced thereinto via the gas supply pipe network 38. The internal pressure of the process chamber 36 is maintained at about $10^{-2}$ Torr, and an RF voltage of 13.56 MHz is applied to the susceptor base 20 and the susceptor 6. With this process, a plasma is generated between the susceptor 6 and the ceiling portion 34B. At the same time, the permanent magnet 42 is rotated to form a magnetic field near the wafer W, thus performing anisotropic etching of the wafer W.

When the wafer W is to be etched, low-temperature etching can be performed with respect to a surface to be processed by sequentially transferring the low temperature from the cooling jacket 62 arranged in the cooling jacket housing base 50 to the susceptor base 20, the susceptor 6, and the wafer W. In this case, the processing temperature of the wafer W is controlled by controlling the amount of heat generated by the heater 54 arranged on the susceptor base 20. A heat transfer gas such as a helium gas is also supplied into the space 72 between the cooling jacket housing base 50 and the susceptor base 20 and the space 70 between the susceptor base 20 and the susceptor 6 to improve the heat transfer efficiency.

According to the present invention, the aluminum feeder pin 80 is airtightly fixed to the aluminum susceptor 6 via the polybenzimidazole insulating member 83. For this reason, no heat transfer gas leaks to the lower surface of the electrostatic chuck sheet 4. In addition, since aluminum and polybenzimidazole have almost the same linear thermal coefficient of expansion ($23.6 \times 10^{-6}/°$), even if the electrode portion of the ESC repeatedly undergoes a change in temperature, the following problems can be prevented: cracking in the joint surfaces, leakage of a heat transfer gas, a deterioration in the breakdown characteristics or a dielectric breakdown of the insulating portion, and the like.

Furthermore, since the polybenzimidazole insulating member 83 can be easily removed from the susceptor 6, maintenance, e.g., replacement of the sheet 4, is facilitated.

An ESC according to the second embodiment will be described next with reference to FIGS. 6 to 14. Note that a description of a portion of the second embodiment which is common to the first embodiment will be omitted.

In the second embodiment, the diameter of an upper portion 184 of a feeder hole 182 is smaller than a that of a lower portion 183 thereof. A feeder auxiliary pin 180 is mounted in the feeder hole 182 via an insulating member 186. The feeder auxiliary pin 180 consists of aluminum. In this case, an inner wall 182A of the feeder hole 182 and an outer wall 180A of the feeder auxiliary pin 180 are anodized.

As the insulating member 186, an epoxy-based adhesive, a ceramic material, an engineering plastic material, or the like is used because these materials exhibit stable characteristics in the temperature range from −150° C. to room temperature. When an engineering plastic material is to be used, the material is bonded/fixed to the inner surface of the feeder hole 182 with an adhesive. When a ceramic material is to be used, this material is bonded/fixed to the inner surface of the feeder hole 182 with an adhesive or by brazing. The distal end of a feeder pin 24 is in contact with the lower end of the feeder auxiliary pin 180. An ESC sheet 4 is firmly bonded to the upper surface of a susceptor 6 with an adhesive. As this adhesive, any adhesive exhibiting stable characteristics in the temperature range from −150° C. to +100° C. may be used. For example, an epoxy-based adhesive, an urethane-based adhesive, or an organic or inorganic adhesive is preferably used. Especially, an armstrong epoxy A-12 (trade name) is preferable.

Since the feeder hole 182 is filled with the feeder auxiliary pin 180 and the insulating member 186, there is no difference between the internal and external pressures which acts on the sheet 4, and no partial expansion occurs in the sheet 4. Therefore, the flatness of the electrostatic chuck sheet 4 is maintained at a high level, and there is no degradation in the chucking/holding function of the sheet.

When the electrostatic chuck sheet 4 is degraded, only the sheet 4 may be peeled off to be replaced with a new one, but the feeder auxiliary pin 180 need not be replaced. Therefore, replacement of a chuck sheet can be quickly performed. In addition, since the feeder auxiliary pin 180 is firmly fixed to the susceptor 6 with the insulating member 186, reliable mounting of the feeder auxiliary pin 180 can be realized, and its durability is greatly improved as compared with a conventional feeder auxiliary pin.

A method of assembling a feeder circuit assembly of the electrostatic chuck and an assembly jig will be described next with reference to FIGS. 7 to 14.

Figure 8:
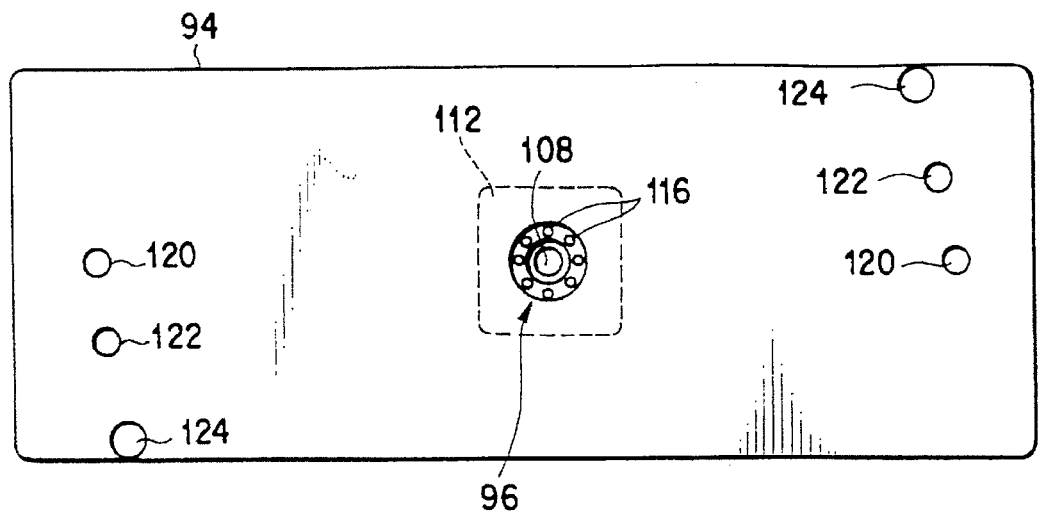
FIG. 8 is a plan view showing an assembly jig body.
Figure 9:
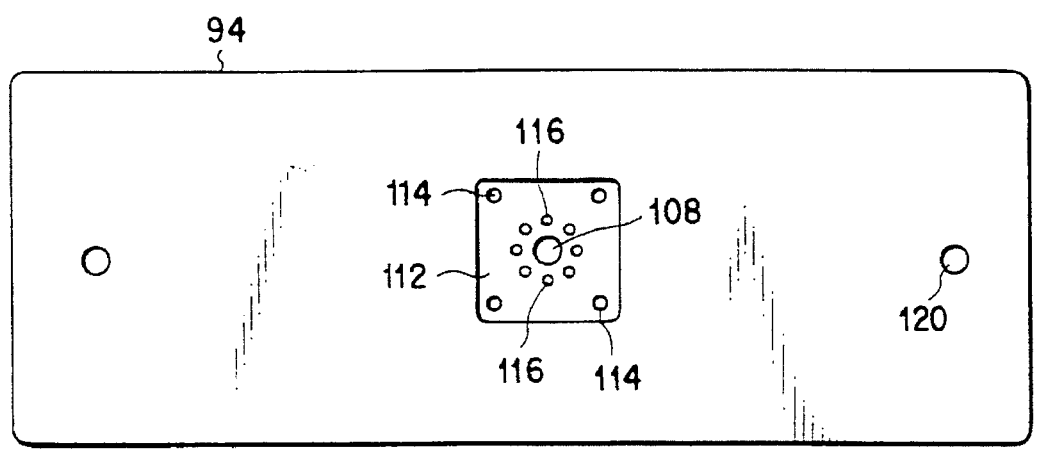
FIG. 9 is a bottom view of the assembly jig body.

As shown in FIGS. 7 and 8, an assembly jig body 94 is a rectangular aluminum plate. A holding portion 96 is formed at a substantially central portion of the assembly jig body 94. The holding portion 96 is used to detachably mount the feeder auxiliary pin 180 on the assembly jig body 94 at a right angle to the plate surface.

The holding portion 96 has an opening portion 98, an opening stepped portion 100, an insertion hole 102, and an insertion hole bottom portion 104. The opening portion 98 is formed to have an area equal to or slightly larger than that of the lower end opening portion of the feeder hole 182. The opening stepped portion 100 is formed by reducing the diameter of the opening portion 98. The insertion hole 102 is formed in the center of the opening stepped portion 100 to be slightly larger than the proximal end portion of the feeder auxiliary pin 180 so as to allow it to be inserted. The insertion hole bottom portion 104 is formed at a substantially middle stage in the direction of thickness of the assembly jig body 94.

Figure 11:
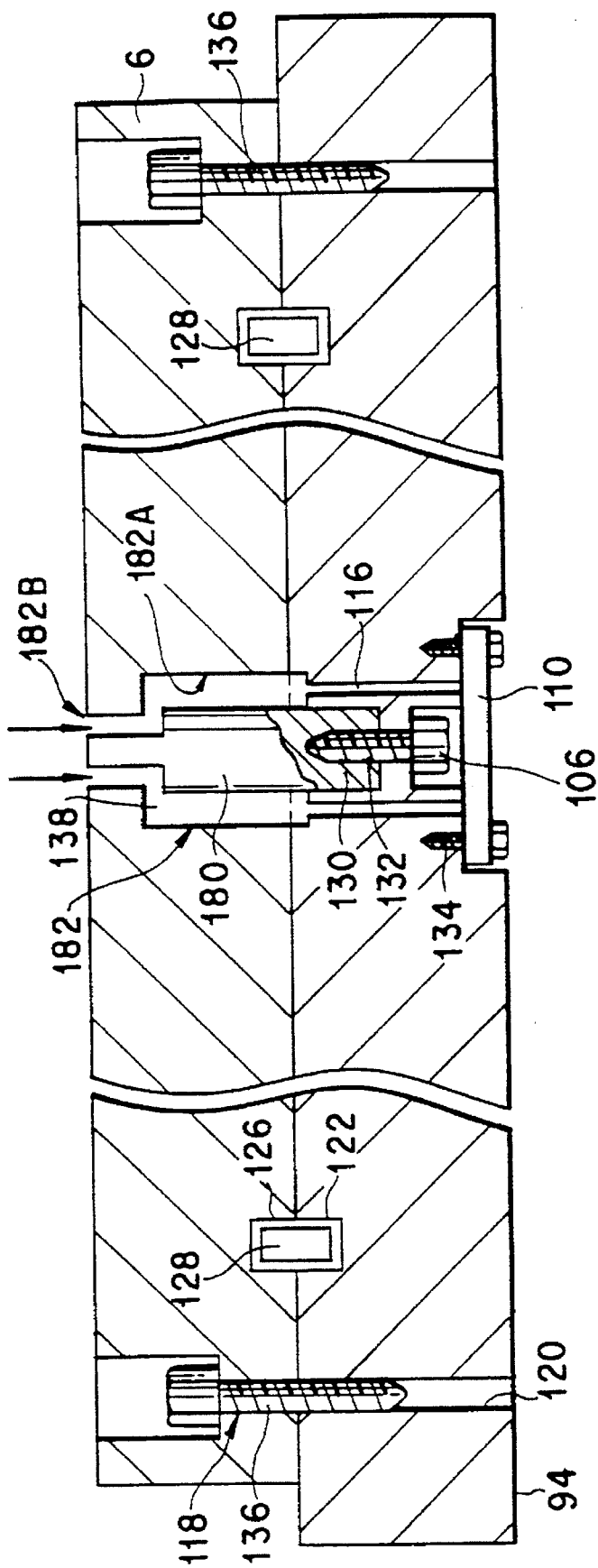
FIG. 11 is a longitudinal sectional view showing an assembly of the assembly jig body and a susceptor.

As shown in FIG. 11, a pin screw hole 108 is formed in the insertion hole bottom portion 104 to allow a pin fixing bolt 106 to be threadably engaged and inserted therein from the lower side of the insertion hole bottom portion 104. With this structure, the proximal end of the feeder auxiliary pin 180 is threadably engaged with the distal end of the inserted pin fixing bolt 106.

As shown in FIG. 7, a recess portion 112, in which a blind plate 110 is mounted when an insulating member is to be filled, is formed below the insertion hole bottom portion 104. Four bolt holes 114 for mounting the blind plate are formed in the bottom surface of the recess portion.

An exhaust hole 116 is formed in the opening stepped portion 100 to extend therethrough to the recess portion 112 side. The exhaust hole 116 has a function of exhausting a gas in the feeder hole 182 in filling a fluid insulating member to aid a smooth filling operation. Note that eight exhaust holes 116 are formed along the circumferential direction of the opening stepped portion 100 at equal angular intervals.

As shown in FIG. 11, two fixing bolt holes 120 are formed in a peripheral portion of the assembly jig body 94 to extend therethrough so as to communicate with bolt holes 118 on the susceptor 6 side. The two fixing bolt holes 120 are formed to be point symmetrical about the holding portion 96.

As shown in FIG. 8, two holes 122 with bottoms are formed in the edge portion of the upper surface of the assembly jig body 94. The two jig positioning holes 122 are formed to be point symmetrical about the holding portion 96.

As shown in FIG. 11, susceptor positioning holes 126 are formed in the rear surface side of the susceptor 6 to correspond to the jig positioning holes 122. Positioning pins 128 are clamped between these holes in an inscribed state, thus positioning the members 94 and 6.

Figure 10:
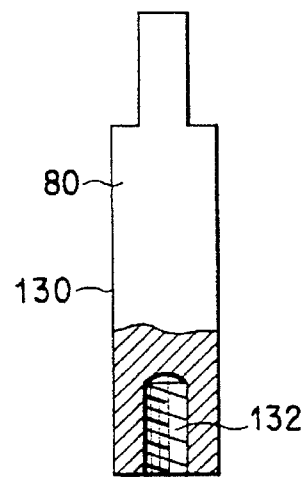
FIG. 10 is a partially cutaway sectional view of a portion of the prototype for a feeder auxiliary pin used for assembly.

As shown in FIG. 10, the proximal end portion of a prototype 130 for the feeder auxiliary pin before it is mounted is longer than that of the finished pin. A pin bolt hole 132 threadably engaged with the pin fixing bolt 106 is formed in the lower end portion of the prototype 130. The depth of the pin bolt hole 132 is set such that the pin does not reach the lower surface of the susceptor upon mounting of the pin.

An assembly process using the assembly jig having the above arrangement will be described next.

First of all, the feeder hole 182 for allowing the feeder auxiliary pin 180 to be inserted therein is formed in the center of the susceptor 6 in advance. The pin fixing bolt 106 is inserted from the lower side in the pin screw hole 108 of the insertion hole bottom portion 104 formed in the central portion of the assembly jig body 94 while the pin fixing bolt 106 is threadably engaged therewith. In addition, the distal end of the pin fixing bolt 106 is threadably engaged with the pin bolt hole 132 of the prototype 130, thereby reliably fixing the prototype 130 for the feeder auxiliary pin to the distal end of the pin fixing bolt 106 in the insertion hole 102 of the holding portion 96.

While the positioning pins 128 are inserted in the corresponding holes 122 of the assembly jig body 94 with the upper portions of the pins protruding therefrom, the susceptor 6 is joined to the assembly jig body 94 from the above while the susceptor 6 is positioned with respect to the assembly jig body 94. In this case, by inserting the upper portions of the positioning pins 128 in the susceptor positioning holes 126, positioning is accomplished. In this state, the susceptor 6 and the assembly jig body 94 are firmly fastened/fixed to each other with two bolts 136.

In this state, the feeder auxiliary pin 180 is accurately positioned at the center of the feeder hole 182 of the susceptor 6 and is separated from the inner wall 182A of the feeder hole 182 by a predetermined distance throughout the total circumference, thus forming a ring-like space 138.

Subsequently, a fluid adhesive having an insulating property, e.g., an adhesive composed of an epoxy resin, is injected and filled, as an insulating member, in the space 138 via an upper end opening portion 182B of the feeder hole 182. In injecting the adhesive, an injecting tool such as a syringe is used. In filling the adhesive, since the air (gas) existing in the space 138 is exhausted downward via the exhaust hole 116 formed in a peripheral portion of the opening stepped portion 100, the adhesive can be smoothly filled in the space 138, i.e., the feeder hole 182.

As described above, when an adhesive composed of an epoxy resin is filled as an insulating member, the adhesive is heated to about 70° C. in this state and kept in a constant temperature bath for about three hours to be hardened, thereby forming the insulating member 186 around the feeder auxiliary pin 180. Note that the adhesive melted and flowed downward due to heating is received by the attached blind plate 110 when the adhesive is put in the constant temperature bath.

When the insulating member 186 is completely hardened in this manner, the assembly jig body 94 is removed from the susceptor 6, and the pin fixing bolt 106 is also removed from the proximal end portion of the feeder auxiliary pin 180. In the state shown in FIG. 13, unnecessary adhesive portions 140 and 142 remain around the upper and lower openings of the feeder hole 182. In addition, an unnecessary portion 144, of the prototype 130 for the feeder auxiliary pin, in which the pin bolt hole 132 is formed still remains protruding. When these unnecessary portions 130, 132, 142, and 144 are removed by a mechanical grinding process, the feeder auxiliary pin 180 has the shape shown in FIG. 14.

With the use of the assembly jig body 94, the feeder auxiliary pin 180 can be accurately positioned and quickly mounted in the feeder hole.

In addition, since the feeder circuit has a simple structure, it can be quickly mounted and allows easy mass production.

Figure 15:
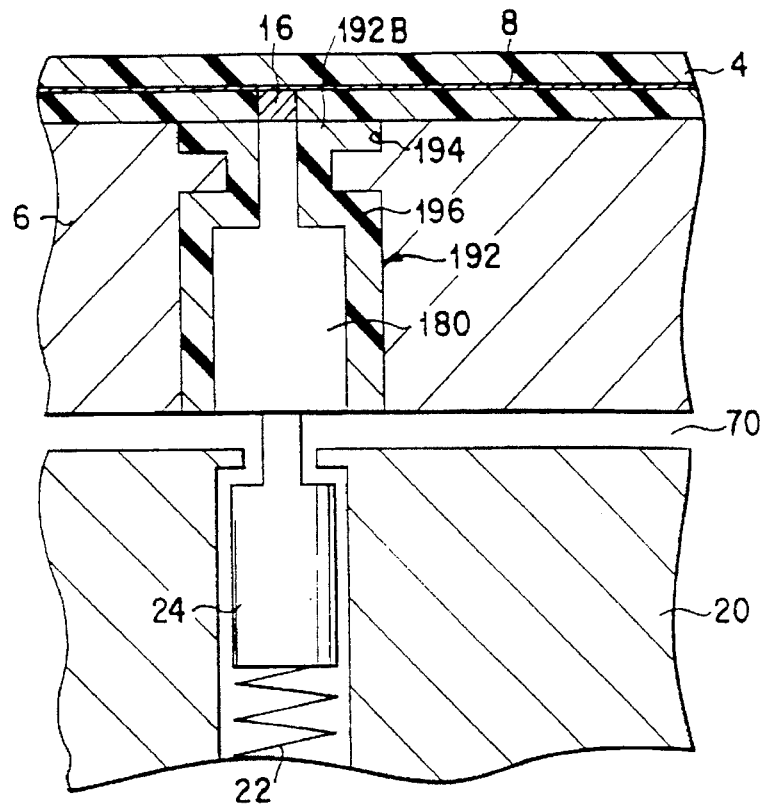
FIG. 15 is a partial sectional view showing an electrostatic chuck according to the third embodiment of the present invention.
Figure 16:
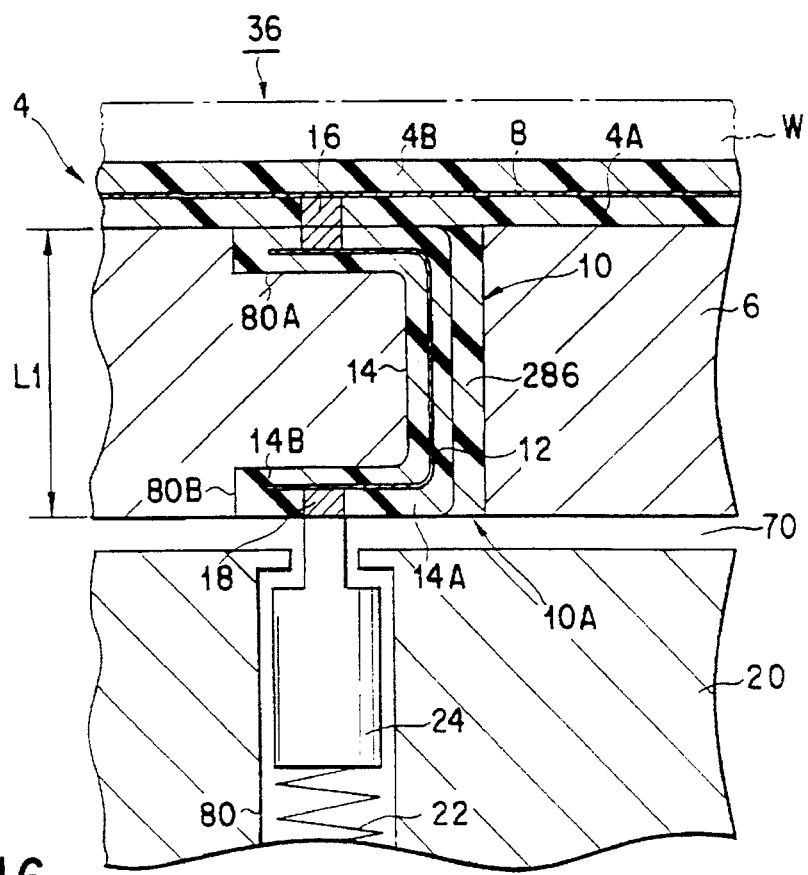
FIG. 16 is a partial sectional view showing an electrostatic chuck according to the fourth embodiment of the present invention.

As shown in FIG. 15, an upper end opening portion 192B of a feeder hole 192 may be formed as wide as its central portion. With this structure, the distance between the feeder auxiliary pin 180 and an inner wall 192A of the feeder hole 192 at the upper end of the pin can be made to be long, and a higher dielectric strength can be obtained.

In this embodiment, the feeder auxiliary pin 180 is designed to have a stepped portion by decreasing the diameter of the pin distal portion and increasing the central portion. However, the shape of the pin is not specifically limited. For example, the pin may have a so-called straight pin structure having a columnar shape, in which the diameter of the pin remains the same along the longitudinal direction.

Electrostatic chucks of the fourth, fifth, and sixth embodiments will be respectively described next with reference to FIGS. 16 to 20.

Figure 1:
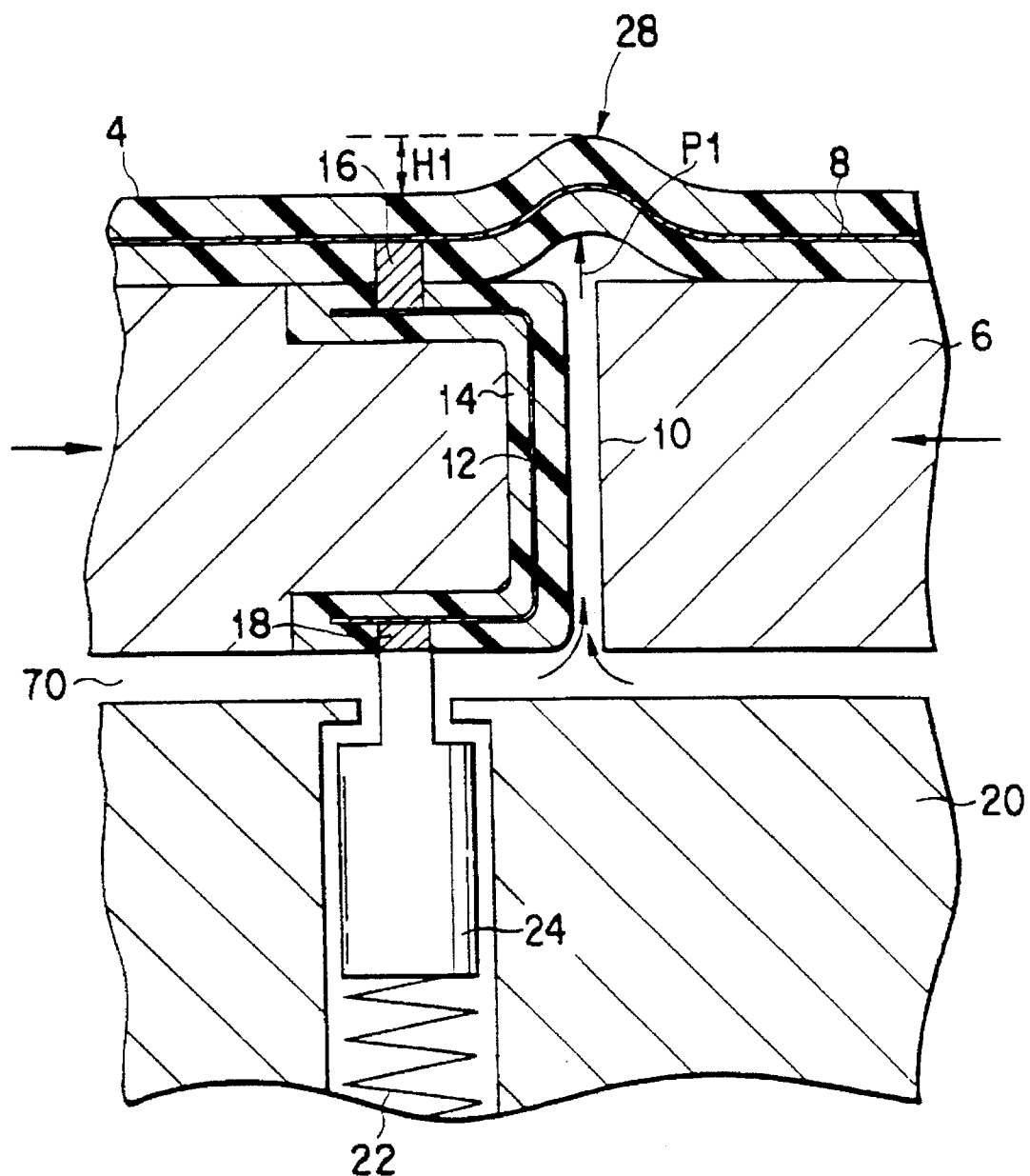
FIG. 1 is a partial sectional view showing a conventional electrostatic chuck.

The feeder circuit assembly of the ESC of the fourth embodiment has a feeder sheet 14 having the same structure as that of the conventional feeder sheet shown in FIG. 1, except that an insulating seal member 286 is filled in a clearance 10. Upper and lower bent portions 80A and 80B of the feeder sheet 14 are respectively bonded to the upper and lower surface portions of a susceptor 6 with an epoxy-based adhesive.

As the seal member 286, any material exhibiting stable characteristics in the temperature range from −150° C. to room temperature or +100° C. may be used. For example, an epoxy-based adhesive or an organic or inorganic adhesive is preferably used. Especially, an armstrong epoxy A-12 (trade name) is preferable. Instead of such an adhesive, or in addition to such an adhesive, an engineering plastic material, a ceramic material, or the like may be used. Such an adhesive constituting the seal member 286 is injected into the clearance 10 via a lower opening portion 10A by using a syringe or the like after the feeder sheet 14 is mounted. A thickness $L_1$ of the susceptor 6 is about 20 mm.

Figure 17:
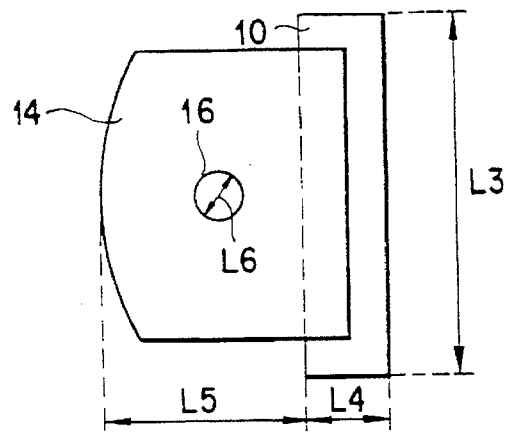
FIG. 17 is a plan view showing a susceptor before an electrostatic chuck sheet is provided for the electrostatic chuck of the fourth embodiment.

As shown in FIG. 17, the clearance 10 is formed to have a size large enough to allow the feeder sheet 14 to extend through. A length $L_3$ and a width $L_4$ of the clearance 10 are respectively set to be 12 mm and 2 mm. Note that the feeder sheet 14 is bent to have a U-shaped cross-section. However, since the feeder sheet 14 consists of a flexible material such as a polyimide resin, there is no possibility of damaging the sheet.

A length $L_5$ of each of the upper bent portion 80A (on the mount surface side of the susceptor 6) and the lower bent portion 80B (on the opposite surface side to the mount surface side) of the feeder sheet 14 is set to be 10 mm. A portion of an insulating film 14A and a portion of a resin film 4A, located at a portion where the upper bent portion 80A opposes the sheet 4, are removed to form a circular hole having a diameter $L_6$ (about 2 mm) and reaching a conductive film 8. A connecting conductor 16 consisting of a silver conductive paste is filled in this hole to electrically connect the conductive film 8 of the sheet 4 to a feeder film 12 of the feeder sheet 14. In addition, a portion of the insulating film 14A, located at the lower bent portion 80B of the feeder sheet 14, is removed to form a circular hole having a diameter of about 2 mm and reaching the feeder film 12. A connecting conductor 18 consisting of a silver conductive paste is buried in this hole.

Figure 18:
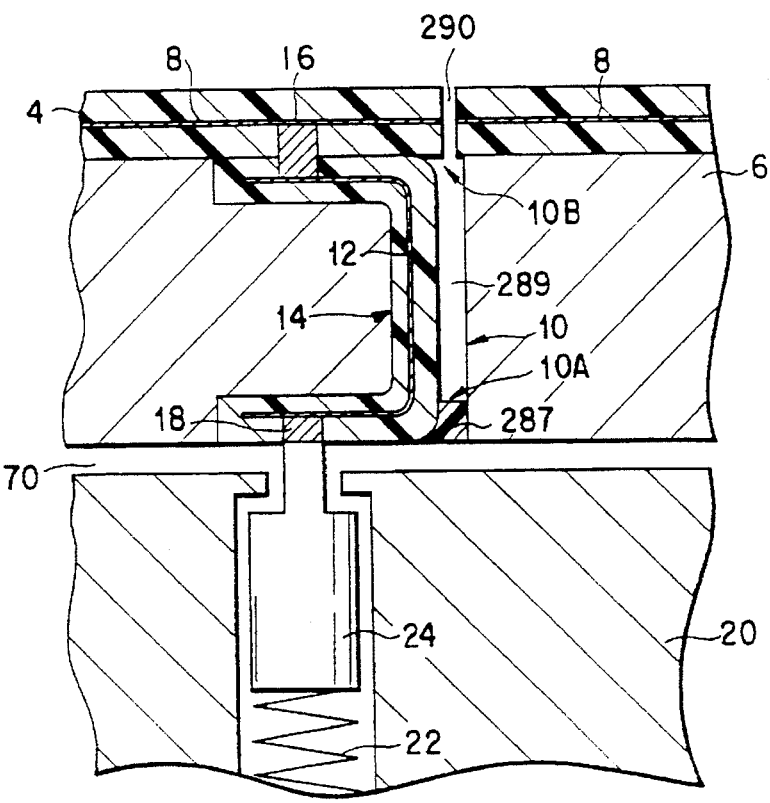
FIG. 18 is a partial sectional view showing an electrostatic chuck according to the fifth embodiment of the present invention.

As shown in FIG. 18, only the lower opening portion 10A Of the clearance 10 may be sealed by a seal member 287. In this case, air may remain in a space 289 in the clearance 10. Therefore, a communicating hole 290 communicating with the upper opening portion 10B and a process chamber 36 is preferably formed in the electrostatic chuck sheet 4.

Figure 19:
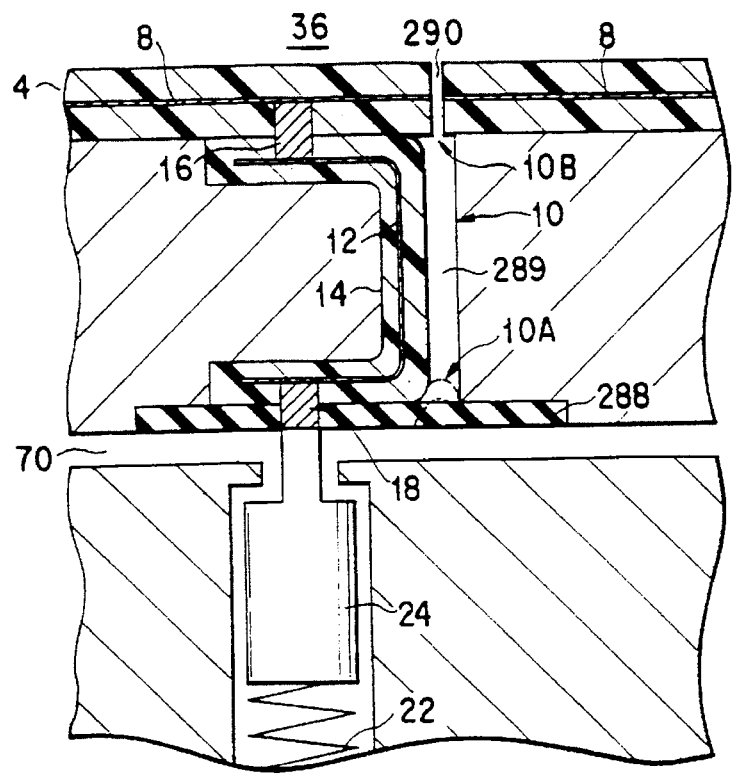
FIG. 19 is a partial sectional view showing an electrostatic chuck according to the sixth embodiment of the present invention.
Figure 20:
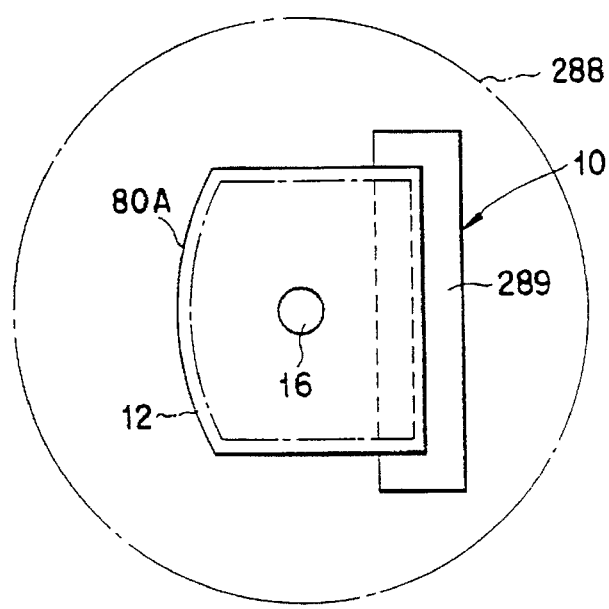
FIG. 20 is a plan view showing the positional relationship between a susceptor, a feeder slit, and a seal sheet member before an electrostatic chuck sheet is provided for the electrostatic chuck of the sixth embodiment.

In addition, as shown in FIGS. 19 and 20, the lower opening portion 10A of the clearance 10 may be sealed by a sheet member 288. Although the sheet member 288 is preferably a polyimide film, an insulating film consisting of a different resin material or a ceramic material may be used as long as the film can withstand a pressure difference of about 1 atm.

The ESC of the seventh embodiment will be described next with reference to FIGS. 21 to 26.

Figure 21:
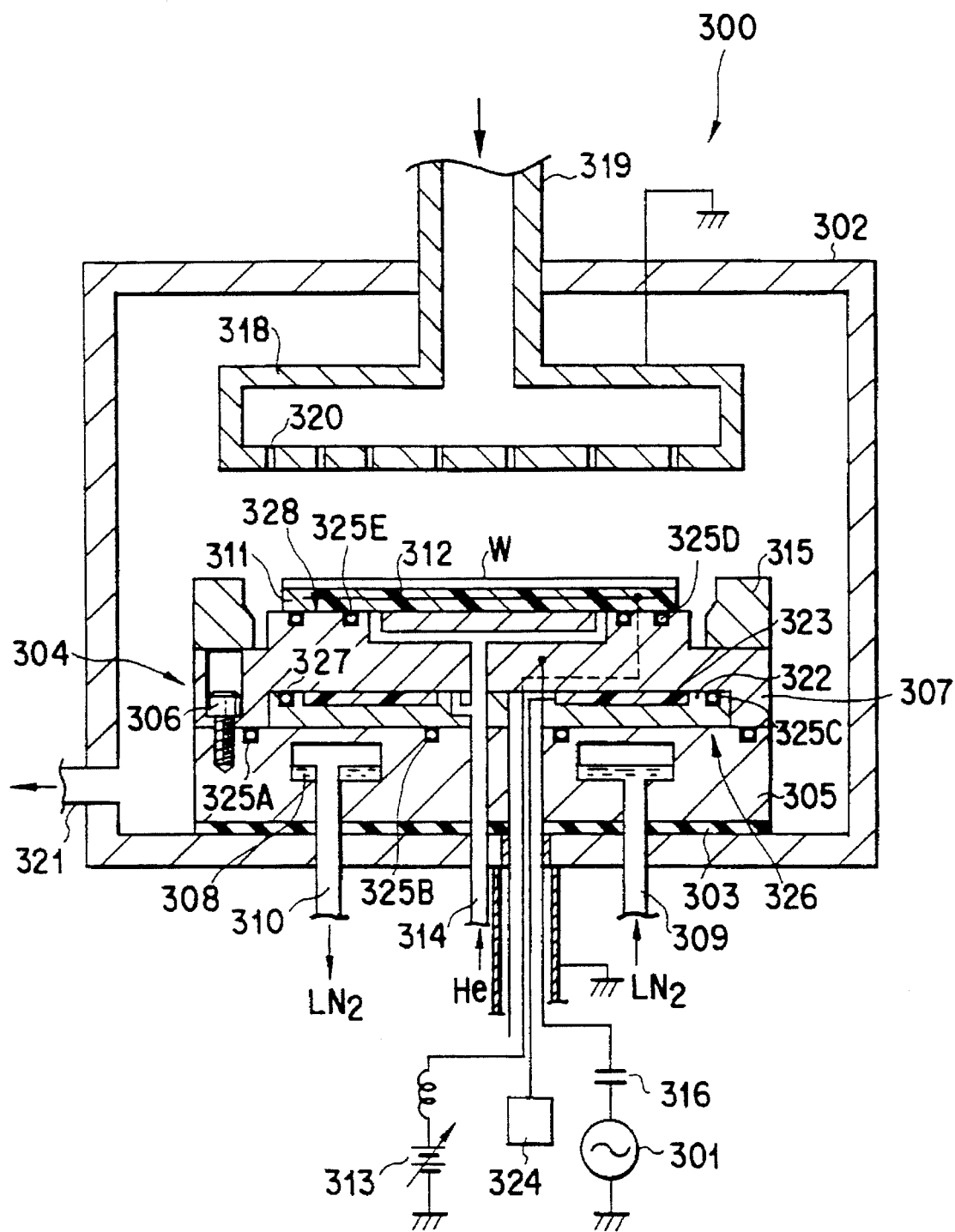
FIG. 21 is a block sectional view showing an etching apparatus having an electrostatic chuck according to the seventh embodiment of the present invention.

As shown in FIG. 21, an etching apparatus 300 has an aluminum chamber 302 housing a susceptor 307 on which a wafer W is placed. The susceptor 304 is supported on a bottom portion of the aluminum chamber 302 via a ceramic insulating plate 303.

A susceptor base 305 has a cooling jacket 308. A refrigerant is introduced into the cooling jacket 308 via an inlet pipe 309. The refrigerant is discharged from the cooling jacket 308 via an exhaust pipe 310. The inlet pipe 309 and the exhaust pipe 310 communicate with a liquid nitrogen source (not shown).

The susceptor 307 has a disk-like shape with an upper end central portion protruding from its remaining portion. An ESC 311 is arranged on a central portion of the susceptor 307. The ESC 311 is formed by sandwiching a conductive film 312 such as a copper foil between two polymer polyimide films. The conductive film 312 is connected to a variable DC high voltage source 313 via a lead line. With this structure, when a high voltage is applied to the conductive film 312, the wafer W can be chucked/held on the upper surface of the conductive film 312 with a coulomb force.

A gas path 314 is formed to extend through the susceptor base 305 and the susceptor 307 so as to supply an He gas to the lower surface of the wafer W, the joint portions between these members, and the joint portions between the members constituting the susceptor 307. An annular focus ring 315 is arranged on an upper end peripheral portion of the susceptor 307 to surround the wafer W. The focus ring 315 consists of an insulating material which attracts no reactive ions, and serves to effectively cause reactive ions to be incident on only the wafer W located inside the ring.

An RF power supply 301 is connected to the susceptor 307 via a matching capacitor 316. In a process, the susceptor 307 can be made to serve as a lower electrode by applying, e.g., 13.56-MHz RF power thereto. A grounded upper electrode 318 is arranged above the susceptor 307 at a position separated therefrom by about 15 to 20 mm. A $CF_4$ gas is supplied to the upper electrode 318 via a gas supply pipe 319 so that the etching gas is uniformly blown into a process space below the upper electrode 318 via a large number of small holes 320 formed in the electrode surface of the upper electrode 318.

An exhaust pipe 321 is connected to a lower side wall portion of the process chamber 302 so that an atmosphere in the process chamber 302 can be exhausted by an exhaust pump (not shown). In addition, a gate valve (not shown) is arranged in a central side wall portion of the aluminum chamber 302 so that loading/unloading of the wafer W can be performed via the gate valve.

A temperature adjusting heater 323 housed in a heater fixing base 322 is arranged below the susceptor between the electrostatic chuck 311 and the cooling jacket 308.

Seal members 325A to 325E are respectively provided for portions, of the etching apparatus 300, for which airtightness is required. More specifically, a pair of seal rings 325A and 325B are provided for a seal joint portion 326 between the upper surface of the susceptor base 305, the lower surface of the susceptor 307, and the lower surface of the heater fixing base 322. The seal ring 325C is provided for a seal joint portion 327 between the lower surface of the susceptor 307 and the upper surface of the heater fixing base 322. A pair of seal rings 325D and 325E are provided for a seal joint portion 328 between the upper surface of the susceptor 307 and the lower surface of the ESC 311.

As shown in FIG. 22, each of the seal rings 325A to 235E has a flexible seal base member 329 with a ring-like shape having a C-shaped cross-section. A coating film 330 is formed on the outer surface of the seal base member 329. As the seal base member 329, a corrosion-resistant, high-modulus material, e.g., a high-quality stainless steel such as SUS316 or a nickel-cobalt alloy such as Inconel or Hastelloy is preferably used because a corrosive gas is used as a process gas.

As a material for the coating film 330, a material exhibiting high ductility or malleability, e.g., a metal material such as indium (In), gold (Au), silver (Ag), zinc (Zn), or copper (Cu); Teflon; or a polymer material such as polymer polyethylene may be used. With the formation of the coating film 330, the affinity for the surfaces of members is improved, and the sealing property is not degraded even at an ultra-low temperature of about −150° C. This coating film 330 may be formed on at least a portion which is brought into contact with the surfaces of the member when the seal ring is inserted. For this reason, in the case shown in FIG. 22, the coating film 330 is formed on only the outer surface of the seal base member 329 but is not formed on its inner surface.

As shown in FIG. 23, the seal member 325D is interposed between the upper surface of the heater fixing base 322 and the lower surface of the susceptor 307. A small space 335 having a width of about 0.1 mm is defined between the susceptor 307 and the heater fixing base 322 to cause proper convection of a heat transfer gas. The seal member 325D is housed in a ring-like seal groove 331 formed in the upper surface of the heater fixing base 322 to have a rectangular cross-section. Upper and lower portions of the seal member 325D are in contact with the two members 307 and 322.

The seal member 325D is in airtight contact with and joined to the heater fixing base 322 and the susceptor 307 at seal joint surfaces 332 and 333. In order to complete a seal joint structure having high airtightness in a low-temperature atmosphere with a relatively small clamping force per unit circumference length, the seal joint surfaces 332 and 333 must be smooth. Note that the seal joint surfaces 332 and 333 need to be electrically insulated.

The surface finishes of the seal joint surfaces 332 and 333 will be described next with reference to FIG. 24.

The present inventors have found that the seal joint surfaces 332 and 333 are preferably finished such that a centerline average roughness Ra defined by JISB0601 and JISB0031 becomes 0.1a to 0.5a, most preferably about 0.2a. First, an aluminum member A like the one shown at (a) in FIG. 24 is prepared. As shown at (b) in FIG. 24, a specific surface of the member A is then anodized to form films B and C. As an electrolytic solution, sulfuric acid, oxalic acid, chromic acid, or the like can be used. In consideration of the fact that a sulfuric-acid-based anodized aluminum film is excellent in crack resistance and hardness, sulfuric acid or oxalic acid is preferably used. Most preferably, sulfuric acid is used. Note that the surface of the member A is preferably ground to an average surface roughness of 6.3a to 12.6a before anodization. That is, if the surface before anodization is too rough, an excess labor is required for a polishing operation, whereas if the surface is too smooth, since the surface is roughened by anodization, the grinding operation becomes a wasteful operation.

As shown at (b) in FIG. 24, the anodized aluminum film formed in this manner is constituted by a permeation layer B formed inside the member A and a growth layer C formed outside the member A. If, for example, an anodized aluminum film having a thickness of 50 μm is formed, the permeation layer B and the growth layer C each have a thickness of about 25 μm. In addition, a porous layer must be removed from the growth layer C to prevent corrosion or leakage. For this purpose, a hole sealing process is performed by using a vapor to convert the surface of the oxide film into a boehmite surface. However, as shown in Table 1, since the surface roughness after a vapor hole sealing process becomes 1.0a or more, the surface must be finished by a polishing process to become smooth. For this purpose, a surface polishing process is performed by using a polishing agent such as a diamond paste.

As shown at (c) in FIG. 24, the growth layer C is removed from the surface of the member A by a thickness of about 20 μm to finish the surface so as to have an average surface roughness 0.1a to 0.5a, preferably about 0.2a. Note that if the growth layer C is removed up to the permeation layer B, the member A may be exposed. For this reason, a polishing/removing process is preferably performed within the thickness of the growth layer C.

Figure 25:
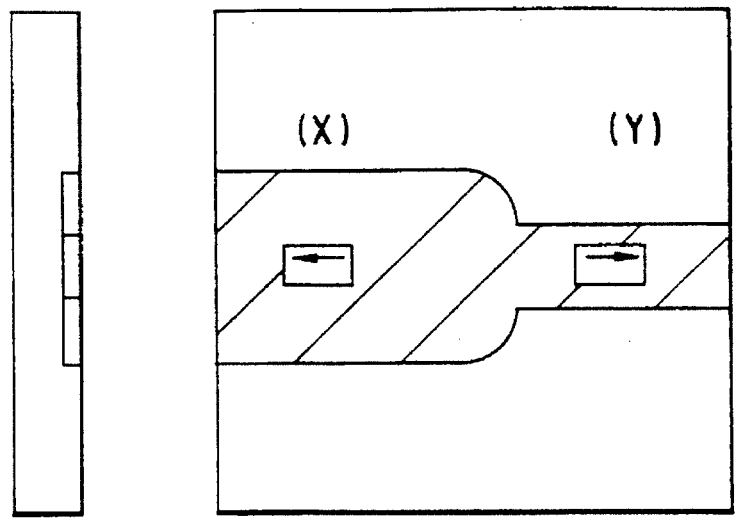
FIG. 25 contains views of test piece 1.
Figure 26:
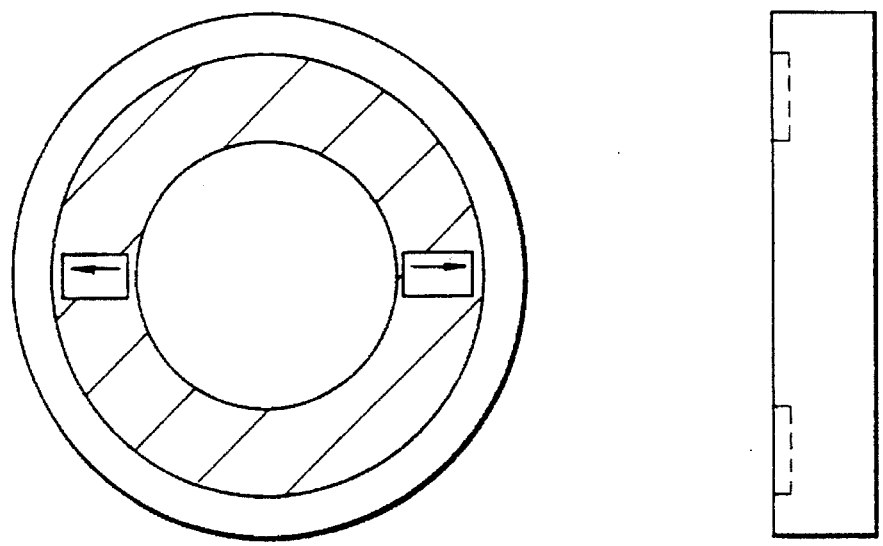
FIG. 26 contains views of test piece 2.

Table 1 shows the results obtained by checks on the following items (a) to (c) by using test piece 1 in FIG. 25 and test piece 2 in FIG. 26.

(a) how much an anodized aluminum surface obtained by a 50-μm hard anodized aluminum sulfate process (vapor hole sealing process) is roughened;

(b) whether it is possible to polish the anodized aluminum surface to achieve surface roughnesses of 0.1a, 0.2a, and 0.4a; and (c) how much a surface subjected to a TiN process is roughened and how rough the surface subjected to the TiN process is after polishing (comparative example).

Test piece 1 is manually polished by using a diamond powder. Test piece 2 is mechanically polished by using a diamond powder. Referring to FIGS. 25 and 26, the hatched portions indicate polished portions, and the arrow regions in the hatched portions indicate regions subjected to measurement of surface roughness. In Table 1, items A, B, and C indicate measurement results obtained by using test piece 2; items D, F, and H, measurement results obtained at a portion X of test piece 1; items E, G, and I, measurement results obtained at a portion Y of test piece 1; and items J, K, L, and M, measurement results obtained at the portion X of test piece 1. Note that "kanigen process" indicates an electroless plating.

TABLE 1

| Item | Process Contents | Actual Measurement Value |
|---|---|---|
| A-1 | surface (processed surface) before anodization | 0.4a |
| A-2 | surface after 50-μm hard anodized aluminum sulfate (vapor hole sealing) process | 1.3a |
| A-3 | polished surface after 50-μm hard anodized aluminum sulfate process | 0.2a |
| B-1 | surface (processed surface) before anodization | 0.2a |
| B-2 | surface after 50-μm hard anodized aluminum sulfate (vapor hole sealing) process | 1.3a |
| B-3 | polished surface after 50-μm hard anodized aluminum sulfate process | 0.4a |
| C-1 | surface (processed surface) before anodization | 0.1a |
| C-2 | surface after 50-μm hard anodized aluminum sulfate (vapor hole sealing) process | 1.2a |
| C-3 | polished surface after 50-μm hard anodized aluminum sulfate process | 0.4a |
| D-1 | surface (processed surface) before anodization | 0.4a |
| D-2 | surface after 50-μm hard anodized aluminum sulfate (vapor hole sealing) process | 1.7a |
| D-3 | polished surface after 50-μm hard anodized aluminum sulfate process | 0.4a |
| E-1 | surface (processed surface) before anodization | 0.4a |
| E-2 | surface after 50-μm hard anodized aluminum sulfate (vapor hole sealing) process | 1.4a |
| F-1 | surface (processed surface) before anodization | 0.2a |
| F-2 | surface after 50-μm hard anodized aluminum sulfate (vapor hole sealing) process | 1.4a |
| F-3 | polished surface after 50-μm hard anodized aluminum sulfate process | 0.2a |
| G-1 | surface (processed surface) before anodization | 0.2a |
| G-2 | surface after 50-μm hard anodized aluminum sulfate (vapor hole sealing) process | 1.6a |
| H-1 | surface (processed surface) before anodization | 0.1a |
| H-2 | surface after 50-μm hard anodized aluminum sulfate (vapor hole sealing) process | 1.5a |
| H-3 | polished surface after 50-μm hard anodized aluminum sulfate process | 0.1a |
| I-1 | surface (processed surface) before anodization | 0.1a |
| I-2 | surface after 50-μm hard anodized aluminum sulfate (vapor hole sealing) process | 1.5a |
| J-1 | surface after kanigen process | 0.2a |
| J-2 | surface after TiN process | 1.0a |
| K-1 | surface after kanigen process | 0.1a |
| K-2 | surface after TiN process | 1.7a |
| L-1 | surface after kanigen process | 0.1a |

TABLE 1-continued

| Item | Process Contents | Actual Measurement Value |
| --- | --- | --- |
| L-2 | surface after TiN process | 0.9a |
| M-1 | surface after kanigen process | 0.2a |
| M-2 | surface after TiN process | 0.9a |

As indicated by items A to I in Table 1, even if each sample was finished to have a smooth surface before a vapor hole sealing process, the surface of each sample was considerably roughened after the process. Therefore, it was found that polishing need not be performed beyond an average surface roughness of 6.3a to 12.6a before a vapor hole sealing process.

In addition, as indicated by items A to I, it was found that each sample could be finished within the average roughness range from 0.1a to 0.5a by polishing the surface of each sample after a vapor hole sealing process by using a polishing agent such as a diamond powder. It was found that a high sealing effect was obtained by polishing the surface of each sample to an average roughness of 0.1a to 0.5a, preferably about 0.2a.

Furthermore, as indicated by items J to M as comparative examples, when a TiN process was performed with respect to an undercoating which had undergone a kanigen process, the surface was considerably roughened. In addition, since the kanigen-processed undercoating was exposed, a polishing process could not be performed. It was, therefore, found that none of the comparative examples could be used as a seal joint member for a low-temperature process apparatus.

As described above, when the seal member 325D is clamped between the seal joint surfaces 332 and 333 formed on the basis of the present invention with a clamping force of, e.g., 8 kgf/cm to 10 kgf/cm per unit circumference length by using a proper number of bolts, a leak-tight seal joint structure of, e.g., $1\times10^{-6}$ atm·cc/sec (leak rate of herium gas) or less can be obtained.

The electrostatic chuck of the eighth embodiment will be described next with reference to FIGS. 27 to 29.

The ESC of the eight embodiment uses a ceramic film (a semiconductor film having a low resistivity) such as an SiC film instead of a polyimide film (insulating film) so as to use an attractive force based on a Johnsen-Rahbek effect (to be simply referred to as a Johnsen-Rahbek force hereinafter) for chucking of a wafer W. An ESC using the Johnsen-Rahbek effect is described in Solid State Technology, January 1993, pp. 89–90.

A Johnsen-Rahbek force is generated when a current (to be referred to as a chuck current hereinafter) is flowed from a semiconductor film having a low resistivity to a wafer. Therefore, for example, a MOS IC gate oxide film formed on a wafer may be destroyed by a chuck current. For this reason, it is necessary to minimize the chuck current. If, however, the chuck current is excessively reduced, a sufficient wafer chucking/holding force cannot be obtained.

A conventional ESC has a constant-voltage power supply for generating a Johnsen-Rahbek force. That is, the conventional ESC is designed to chuck/hold the wafer W by applying a constant voltage to the electrode. However, if a plasma is generated in the chamber, a self-bias potential is generated. For this reason, as shown in FIG. 29, when, for example, a power of 1,200 V is applied, since a self-bias potential Vdc of −400 V is simultaneously generated, a power of 800 V is actually applied.

In addition, since the self-bias potential Vdc increases with an increase in RF power applied, the electrostatic chucking force is reduced. Furthermore, since the self-bias potential Vdc is greatly influenced by the process conditions, the surface state of a wafer, and the contact resistance, it is almost impossible to control the power to be applied.

Figure 27:
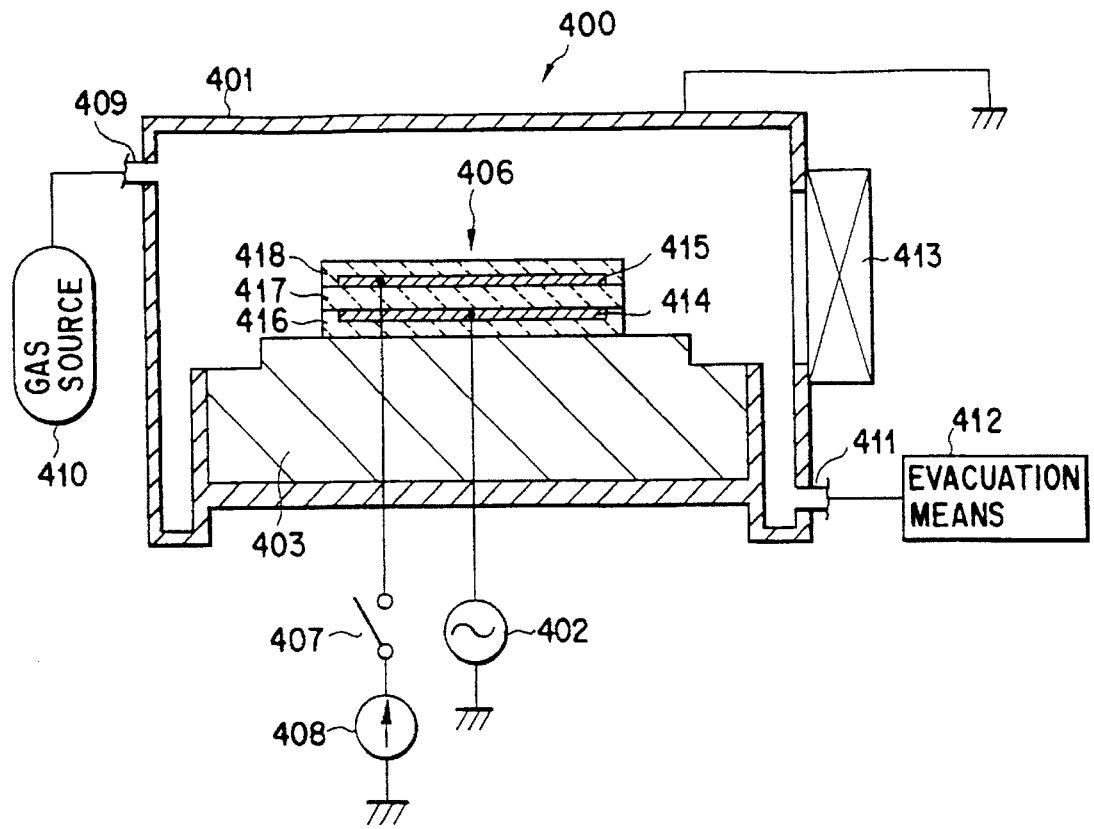
FIG. 27 is a block sectional view showing an etching apparatus having an electrostatic chuck (composed of a ceramic sheet) according to the eighth embodiment of the present invention.

As shown in FIG. 27, an ESC 406 is mounted on a susceptor 403 of an RIE plasma etching apparatus 400. A $CHF_3$ gas is introduced from a gas source 410 into a chamber 401 via an inlet 409. An exhaust port 411 is formed in a lower portion of the chamber 401 so that the chamber 401 can be evacuated to a vacuum by an evacuation means 412 such as a vacuum pump. A gate valve 413 is arranged between the chamber 401 and a load lock chamber (not shown) so that the wafer W can be loaded/unloaded into/from the chamber 401. The susceptor 403 is connected to an RF power supply 402. A wall portion of the chamber 401 is grounded. Therefore, when RF power is applied to the susceptor (lower electrode) 403, a plasma is generated between the susceptor 403 and the wall of the chamber 401.

The ESC 406 is formed by bonding two thin-film electrodes 414 and 415 and three films 416, 417, and 418 to each other. The first electrode 414 is sandwiched between the films 416 and 417. The second electrode 415 is sandwiched between the films 417 and 418. Each of the films 416, 417, and 418 preferably has a thickness of 150 to 500 μm, most preferably 200 to 300 μm. At room temperature, a 300-μm thick ceramic film has a withstand voltage of 4 kV; and a 200-μm thick ceramic film, a withstand voltage of 3 kV. Note that the flatness and average roughness (Ra) of the chucking surface of a ceramic film are set to be less than 3 μm and less than 0.25 μm, respectively.

As the first electrode 414, an Ag-Pd calcined sheet (foil) or a tungsten sheet (foil) is used. As the second electrode 415, an Ag-Pd calcined sheet (foil) is used. As the first film 416, an SiC or $Al_2O_3$ sheet is used. As the second film 417, an SiC or polyimide resin sheet is used. As the third film 418, an SiC sheet is used. Each of the three films 416, 417, and 418 preferably has a resistivity of $10^3$ to $10^{12}$ Ω·cm, most preferably $10^8$ to $10^{10}$ Ω·cm. Note that a ceramic sheet obtained by adding titanium oxide in an $Al_2O_3$ base ceramic material may be used. Although the electrodes 414 and 415 shown in FIG. 27 are of a unipolar type, they may be of a bipolar type or a biased type.

A method of manufacturing the ESC 406 will be briefly described below. The first electrode 414 is bonded to one surface of the first film 416, and one surface of the second film 417 is bonded to the first electrode 414. The second electrode 415 is bonded to one surface of the third film 418, and the other surface of the second film 417 is bonded to the second electrode 415. Such an assembly is integrally and simultaneously sintered. Finally, the other surface of the first film 416 is bonded to the susceptor 403. As an adhesive, a thermosetting adhesive such as an epoxy-based adhesive is used. Note that Kovar members are silver-brazed, as terminals, to the electrodes 414 and 415.

Figure 28:
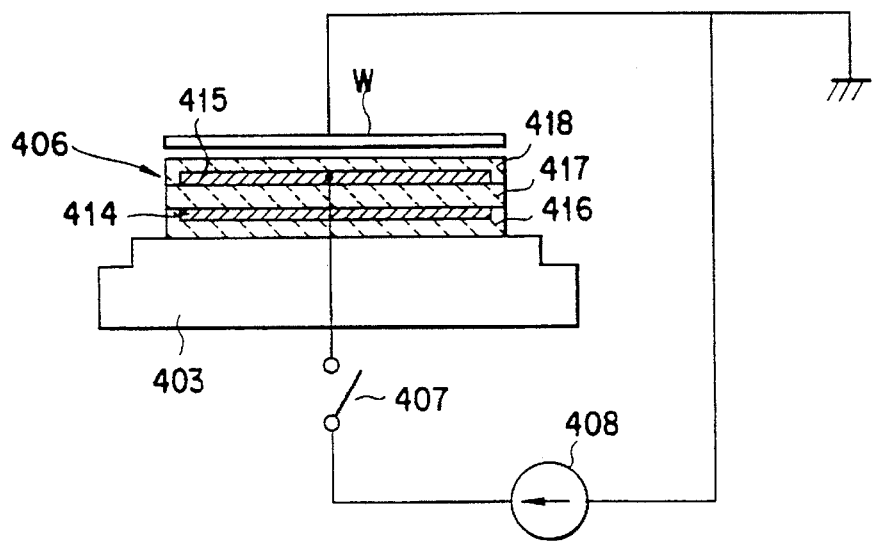
FIG. 28 is an electrical circuit diagram of the electrostatic chuck of the eighth embodiment.
Figure 29:
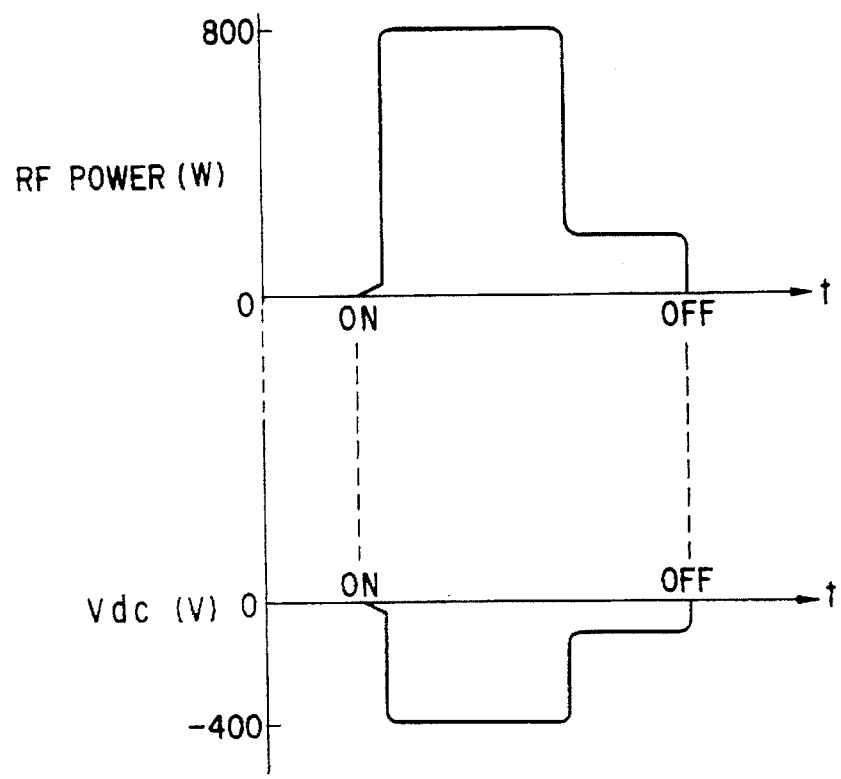
FIG. 29 is a graph showing the relationship between the RF power and the self-bias potential Vdc.

As shown in FIG. 28, since the wafer W can be considered to be grounded via the wall of the chamber 401, the second electrode 415 connected to a constant-current power source 408 via a switch 407 can be considered to form a closed circuit together with the wafer W. With this circuit arrangement, even if the self-bias potential Vdc changes owing to ambient environments, especially application of RF power, a minimum constant current sufficient for generating a Johnsen-Rahbek force can be supplied to the second electrode 415.

This point will be described below with reference to FIG. 29. Letting VS be the voltage applied to the second electrode 415, Vdc, the self-bias potential, R, the contact resistance between the second and third films 417 and 418 and the semiconductor wafer W, and i, the chuck current for generating a Johnsen-Rahbek force, the following equation (1) is established:

$$VS - Vdc = i \times R \qquad (1)$$

The minimum chuck current i sufficient for chucking/holding the wafer W may be experimentally determined in advance. For example, the value of the chuck current i may be set to be 10 µA, and the current may always be maintained at the optimal value by the constant-current power source 408. With reference to equation (1), since the voltage VS is adjusted to always maintain the current i at a constant value in accordance with changes in the self-bias potential Vdc, the optimal Johnsen-Rahbek force can always made to act between the wafer W and the ceramic film 418. Note that the ESC can be used for an ashing apparatus, a sputtering apparatus, an ion implanting apparatus, and an exposure apparatus as well as a dry etching apparatus and a plasma CVD apparatus.

According to the ESC of the above embodiment, even if the self-bias potential changes owing to application of RF power, a stable electrostatic chucking force can always be obtained. In addition, since the minimum necessary current is supplied from the constant-current power source to the electrode, circuits such as a gate oxide film formed on the wafer W are not destroyed.

A method of driving the plasma etching apparatus will be described next with reference to FIGS. 30 to 38, together with a cooling system for the susceptor and the ESC.

Figure 30:
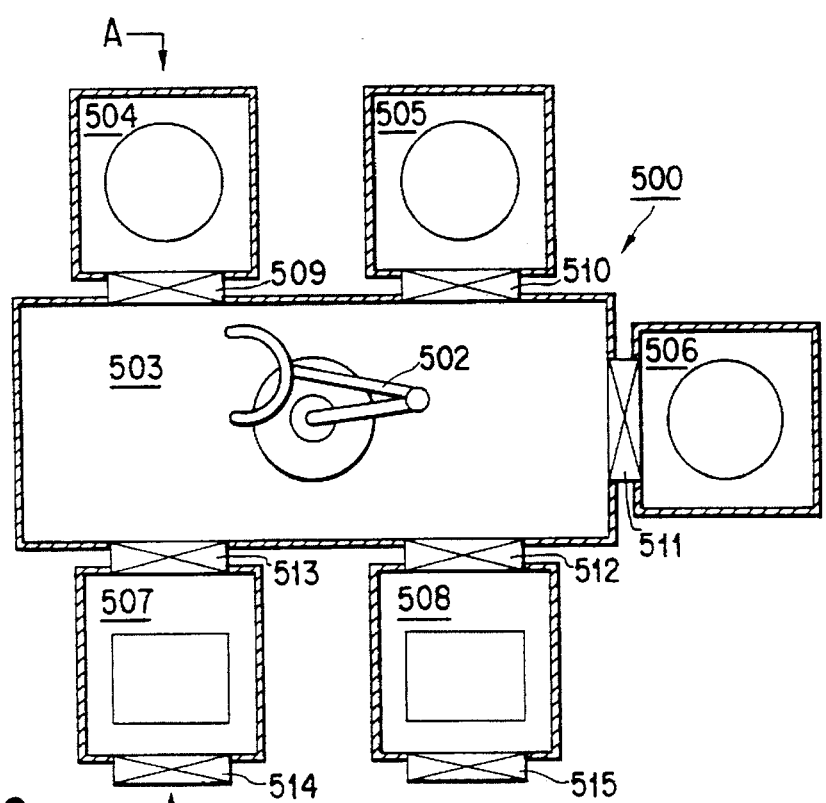
FIG. 30 is a plan view showing the layout of a multi-chamber system.

As shown in FIG. 30, a load lock chamber 503 is arranged in the center of a multi-chamber type plasma etching apparatus 500, and a first process chamber 504, a second process chamber 505, a third process chamber 506, a first cassette chamber 507, and a second cassette chamber 508 are arranged around the load lock chamber 503. The chambers 504 to 508 communicate with the load lock chamber 503 via gate valves 509, 510, 511, 512, and 513, respectively. A convey arm mechanism 502 is arranged in the load lock chamber 503. In addition, the first and second cassette chambers 507 and 508 communicate with the outside (the atmosphere) via gate valves 514 and 515, respectively.

Figure 31:
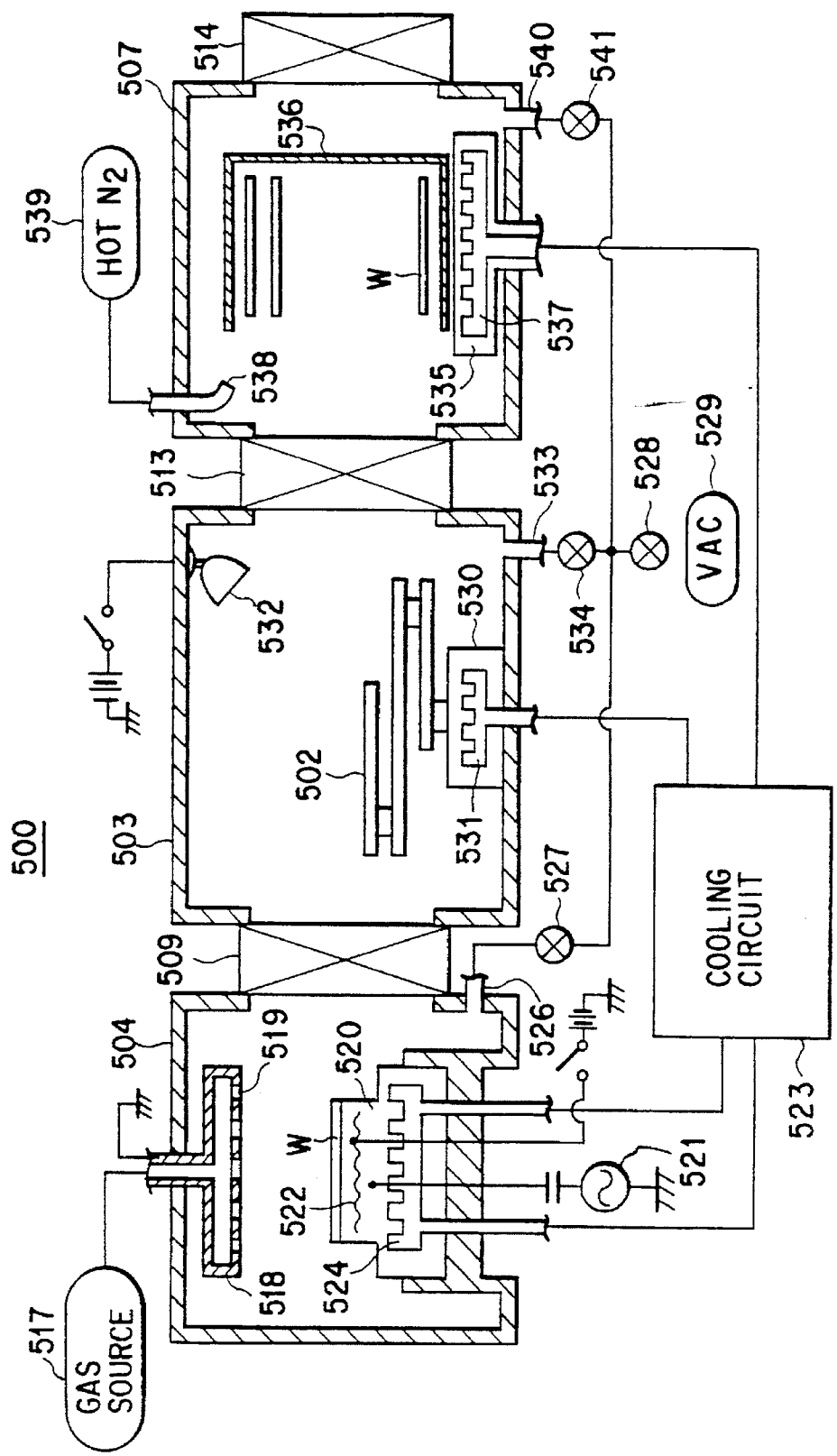
FIG. 31 is a block sectional view showing an electrostatic chuck having a cooling means according to an embodiment.

As shown in FIG. 31, the first process chamber 504 is a hermetic chamber surrounded by an aluminum wall member, and an upper electrode 518 is arranged at an upper portion in the chamber. A large number of gas flow paths 519 are formed in the upper electrode 518. The gas flow paths 519 communicate with a gas source 517. A CF$_4$ gas is blown into the process chamber 504 via the gas flow paths 519.

A susceptor 520 is set at a lower portion in the first process chamber 504. A wafer W is placed on the susceptor 520. The susceptor 520 is connected to an RF power supply 521 to also serve as a lower electrode for generating a plasma in the process chamber 504. The susceptor 520 incorporates a heater 522 and a cooling means 524 connected to a cooling circuit 523. The heater 522 and the cooling means 524 are ON/OFF-controlled in accordance with signals from a controller (not shown).

An exhaust pipe 526 is disposed near the bottom portion of the first process chamber 504. The exhaust pipe 526 communicates with a vacuum pump (VAC) 529 via valves 527 and 528. Upon reception of a signal from the controller (not shown), the VAC 529 evacuates the chamber 504 to a vacuum.

The convey arm mechanism 502 has an extensible arm. A cooling means 531 is incorporated in a mount base 530 of the convey arm mechanism 502. The cooling circuit 523 of the cooling means 531 can cool the wafer W held by the convey arm mechanism 502 in accordance with a signal from the controller (not shown).

A heating lamp 532 is disposed at an upper portion in the load lock chamber 503 and is also ON/OFF-controlled in accordance with signals from the controller (not shown). The wafer W held by the convey arm mechanism 502 is heated by the heating lamp 532. An exhaust pipe 533 is disposed at the bottom portion of the load lock chamber 503. The exhaust pipe 533 communicates with the VAC 529.

A stage 535 on which a wafer cassette 536 is placed is arranged in the first cassette chamber 507. The stage 535 also incorporates a cooling means 537 communicating with the cooling circuit 523 so that the stage 535 and the wafer cassette 536 can be cooled in accordance with a signal from the controller (not shown).

A high-temperature nitrogen blow pipe 538 as a heating means is arranged at an upper portion in the first cassette chamber 507. The high-temperature nitrogen blow pipe 538 communicates with a high-temperature nitrogen source 539 so that a high-temperature nitrogen can be blown into the first cassette chamber 507 in accordance with a signal from the controller (not shown). In addition, an exhaust pipe 540 is arranged at the bottom portion of the first cassette chamber 507. The exhaust pipe 540 communicates with the VAC 529 via a valve 541 and the valve 528.

The operation of this plasma etching apparatus 500 will be described next.

First, the cassette 536 is loaded into the first cassette chamber 507 and placed on the stage 535. The first cassette chamber 507 is then evacuated to $10^{-1}$ Torr. Meanwhile, a refrigerant is supplied from the cooling circuit 523 to the cooling means 537 to cool the stage 535 in advance, thus cooling the wafer cassette 536 and the stored wafer W to, for example, $-50°$ C. to $-80°$ C. in advance. That is, by cooling the wafer W in advance, the time required to cool the wafer W to a process temperature can be shortened. As a result, the throughput of a low-temperature plasma process can be increased.

Subsequently, the wafer W is picked up from the wafer cassette 536 and conveyed to the load lock chamber 503 by the convey arm mechanism 502. The load lock chamber 503 is evacuated to $10^{-3}$ Torr. Meanwhile, the refrigerant is supplied from the cooling circuit 523 to the cooling means 531 to cool the convey arm mechanism 502 itself.

The wafer W is then loaded from the load lock chamber 503 into the process chamber 504 and chucked/held on the susceptor 520 by the electrostatic chuck. Note that the susceptor 520 on which the wafer W is placed must be cooled to an ultra-low temperature range in advance.

When the susceptor 520, which is initially set at room temperature or more, is cooled to a temperature of $-100°$ C. or less at a pressure of $10^{-3}$ Torr, moisture may be condensed into water on the surface of the susceptor 520, thus adversely affecting the wafer W in a plasma process or causing corrosion of the apparatus. Therefore, the amount of moisture trapped on the surface of the susceptor 520 during a susceptor cooling operation must be minimized. For this purpose, cooling of the susceptor 520 is started after the internal pressure of the process chamber 504 is reduced to $10^{-3}$ Torr.

Note that as the internal pressure of the process chamber 504 is decreased, adhesion of moisture to the susceptor 520 in an ultra-low-temperature atmosphere of $-100°$ C. or less can be more effectively prevented. Especially, the target internal pressure of the process chamber 504 is preferably set to be $10^{-5}$ Torr or less.

Even if the amount of moisture adhering to the susceptor 520 is minimized in the above-described manner, a very small amount of moisture is still trapped on the surface of the susceptor 520. Therefore, such residual moisture needs to be removed. A method of removing such moisture will be described below with reference to FIG. 32. For example, by ON/OFF-operating the heater 522 and the cooling means 524, the heating and cooling cycles are repeated with respect to the susceptor 520 in an ultra-low-temperature atmosphere of $-100°$ C. or less in a high vacuum of $10^{-3}$ Torr or less, thus causing the temperature of the susceptor 520 to oscillate between lower and higher temperatures across the dew point.

Figure 32:
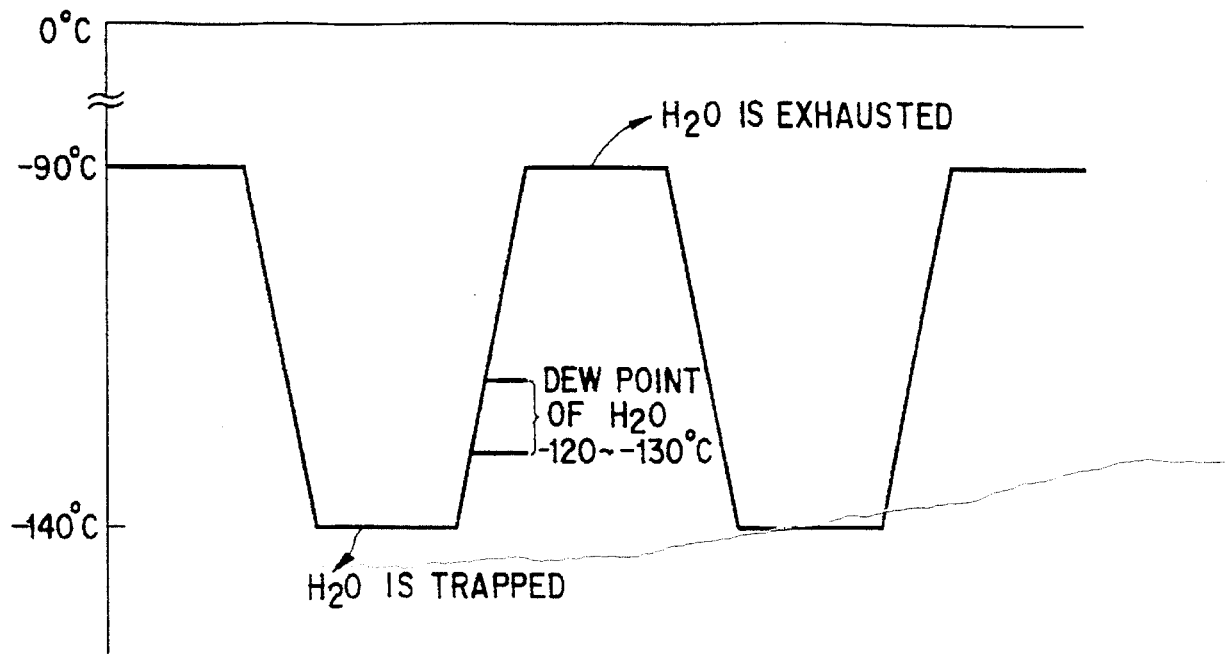
FIG. 32 is a graph of a temperature characteristic curve showing changes in the temperature of a susceptor.

As shown in FIG. 32, in a high value of $10^{-3}$ Torr or less, the temperature of the susceptor 520 is repeatedly changed between, for example, $-90°$ C. and $-140°$ C. With this operation, $H_2O$ trapped at $-140°$ C. can be removed as $H_2O$ vapor at $-90°$ C. By repeating this operation by several cycles, moisture adhering to the susceptor 520 can be completely removed.

After the above preparation is completed, a process gas is introduced into the process chamber 504, and RF power is supplied to the lower electrode, thereby performing plasma etching of the wafer W.

Both the plasma generating operation and the process gas supplying operation are stopped after completed plasma etching. In addition, a nitrogen gas is introduced into the process chamber 504 to replace the process gas and reaction products, and the process chamber 504 is evacuated. Thereafter, the wafer W is unloaded from the first process chamber 504 to the outside of the system via the load lock chamber 503. Assume that all the processes are completed, and maintenance or the like is to be performed. In this case, if the susceptor 520 kept at a low temperature in a vacuum is directly restored to the atmospheric pressure, condensation of moisture may occur. For this reason, the susceptor 520 is preferably restored to the atmospheric pressure after the temperature of the susceptor 520 is increased to room temperature or more by the heater 522.

Another cooling system will be described next with reference to FIGS. 33 to 38.

Figure 33:
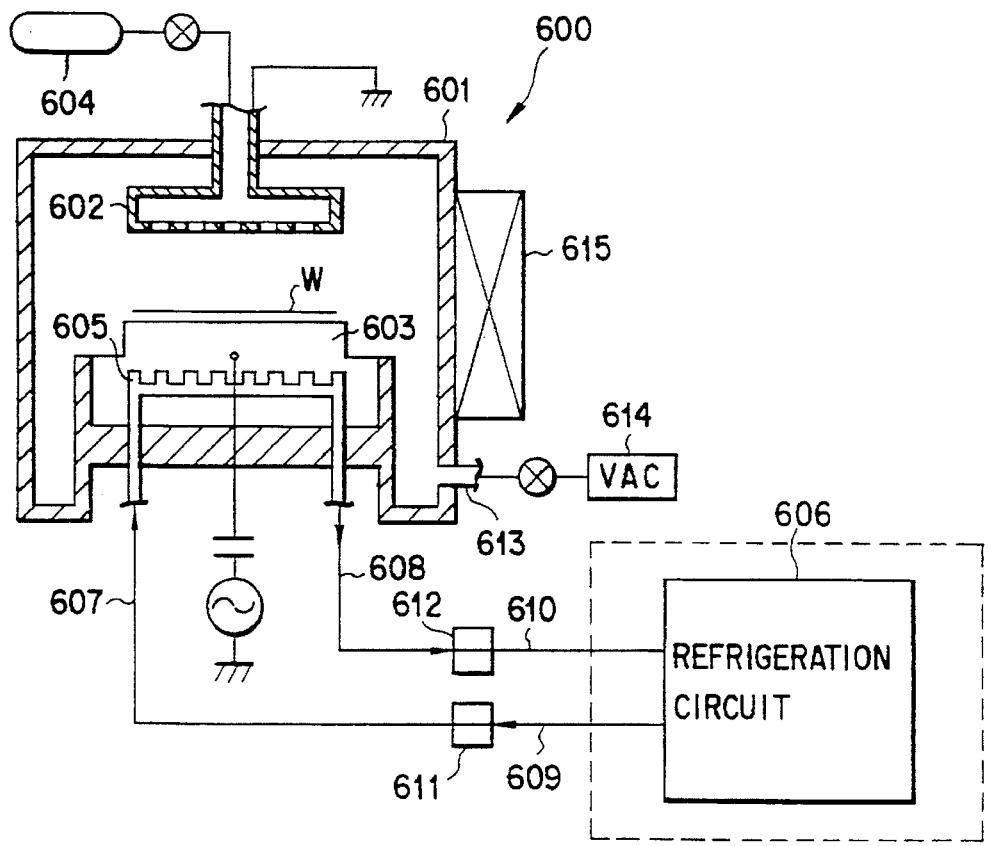
FIG. 33 is a block sectional view showing an electrostatic chuck having a cooling means according to another embodiment.

As shown in FIG. 33, a cooling system including a flow path 605 is arranged to cool a susceptor 603 of a plasma etching apparatus 600. An upper electrode 602 is disposed at an upper portion in a process chamber 601 of the plasma etching apparatus 600. The lower electrode 603 is disposed on the bottom portion of the process chamber 601. The upper electrode 602 has a process gas flow path, through which a $CF_4$ gas or the like is introduced from a process gas source 604 into the process chamber 601.

A flow path 605 is formed in the lower electrode 603. A refrigerant is circulated between the flow path 605 and a refrigeration circuit 606. The flow path 605 is connected to a first refrigerant feed pipe network 607 and a first refrigerant return pipe network 608. The refrigeration circuit 606 is connected to a second refrigerant feed pipe network 609 and a second refrigerant return pipe network 610. With this structure, in a cooling operation, a refrigerant circulation system is formed by connecting the first and second refrigerant feed pipe networks 607 and 609 via a first connection means 611 and connecting the first and second refrigerant return pipe networks 608 and 610 via a second connection means 612.

An exhaust pipe 613 is arranged at a lower portion of the process chamber 601. The exhaust pipe 613 is connected to a vacuum pump 614. Note that a wafer W is loaded into the chamber 601 via a gate valve 615.

Figure 34:
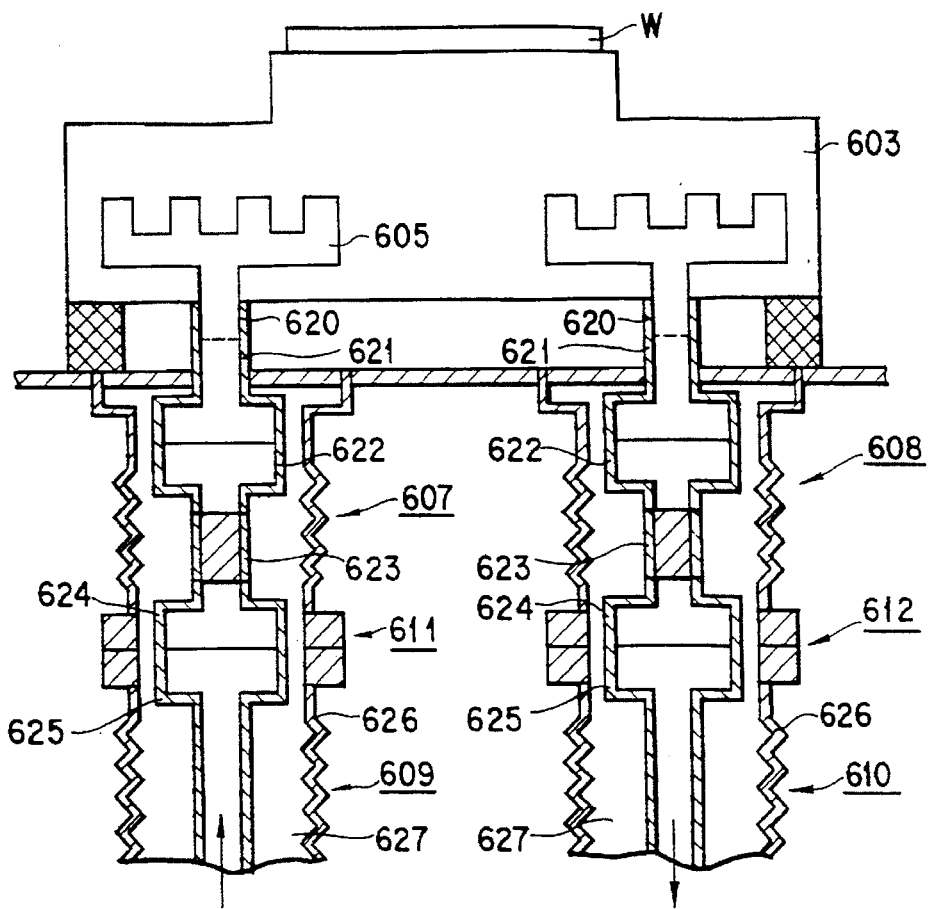
FIG. 34 is a sectional view showing a refrigerant circuit.

Refrigerant circulation piping will be described next with reference FIG. 34.

The lower electrode 603 consists of aluminum and has the flow path 605 formed therein. The flow path 605 communicates with an aluminum supply port member 620. The supply port member 620 is pressed against a pipe coupling 621 consisting of stainless steel. The pipe coupling 621 is connected to a coupling 622 at one end of the first refrigerant feed pipe network 607. In addition, a ceramic insulating portion 623 is arranged midway along the pipe network 607. With this structure, the refrigerant circulation system is insulated from the lower electrode.

A coupling 624 is arranged at the other end of the first refrigerant feed pipe network 607. This coupling 624 can be connected to a coupling 625 at one end of the first refrigerant feed pipe network 609 as needed. These pipe networks 607 and 609 are surrounded by a flexible pipe 626 consisting of stainless steel. A space 627 is defined between the inner surface of the pipe 626 and the outer surfaces of the pipe networks 607 and 609. This space 627 is set in a vacuum state to thermally insulate the refrigerant circulation system with a vacuum. Note that the refrigerant return system (not shown) formed by causing the first and second refrigerant return pipe networks 608 and 610 to communicate with each other via the connection means 612 has an arrangement similar to that described above. Therefore, a description of the refrigerant return system will be omitted.

Figure 35:
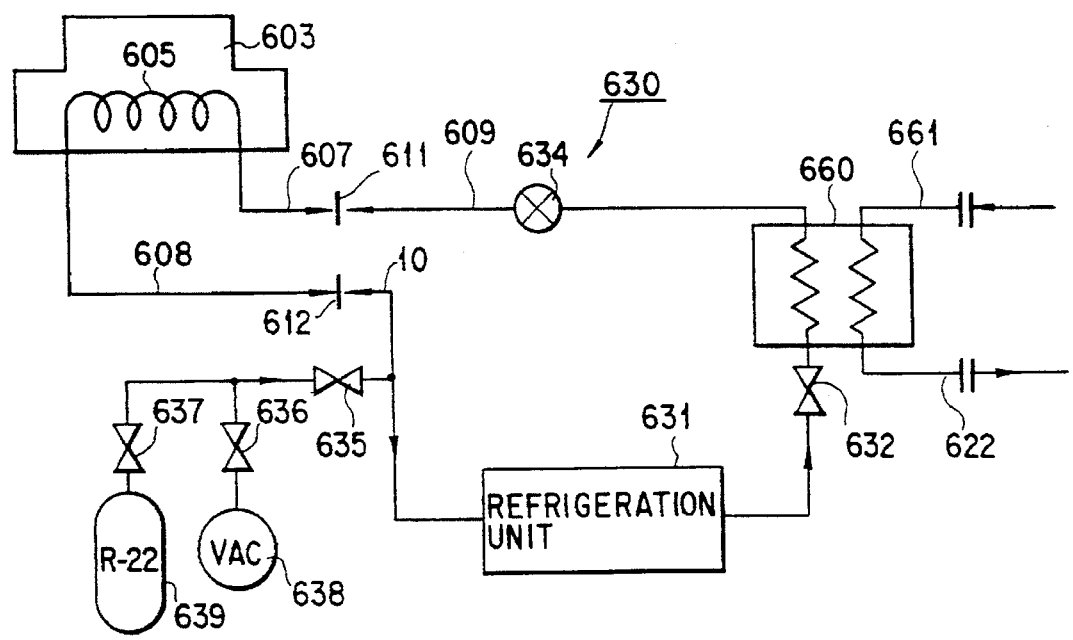
FIG. 35 is a block sectional view showing an electrostatic chuck having a cooling means according to still another embodiment.

A refrigeration circuit 630 will be described next with reference FIG. 35.

The second refrigerant return pipe network 610 of the refrigeration circuit 630 communicates with a refrigeration unit 631. A condenser 660 is connected to the downstream side of the refrigeration unit 631 via a valve 632. In addition, the downstream side of the condenser 660 communicates with the second refrigerant feed pipe network 609, in which an expansion valve 634 is arranged. The pipe network of the refrigeration unit 631 branches on the upstream side. One of the branch pipe networks is designed to selectively communicates with a vacuum pump 638 and a refrigerant source 639 via valves 635, 636, and 637. Note that pipe networks 661 and 662 of the condenser 660 respectively serve as a cooling water inlet and a cooling water outlet.

A procedure for forming a refrigerant circulation path and a susceptor cooling effect at the start of the operation of the refrigeration circuit 630 will be described next.

First, the first and second refrigerant feed pipe networks 607 and 609 are connected to each other by the connection means 611, and the first and second refrigerant return pipe networks 608 and 610 are connected to each other by the connection means 612. With this operation, a refrigerant circulation system is formed between the refrigeration circuit 630 and the internal flow path 605 of the susceptor 603.

Subsequently, the valve 637 is closed, and the valves 632, 635, and 636 are opened to evacuate the refrigerant circulation system by using the vacuum pump 638. Upon completion of the evacuation, the valve 636 is closed, and the valve 637 is opened to introduce a refrigerant (R-22) into the refrigerant circulation system. Thereafter, the expansion valve 634 is opened, and the refrigeration unit 631 and the condenser 660 are operated, thereby feeding the refrigerant cooled to a desired temperature into the internal flow path 605. With this process, the temperature of the susceptor 603 is caused to reach the process temperature within 30 to 40 minutes.

According to the above embodiment, since the refrigeration circuit 630 has no conventional heat exchanger, a cooling system with a high heat exchange efficiency can be provided. Therefore, the susceptor can be quickly cooled to a low temperature, e.g., −100° C. or −110° C.

Figure 36:
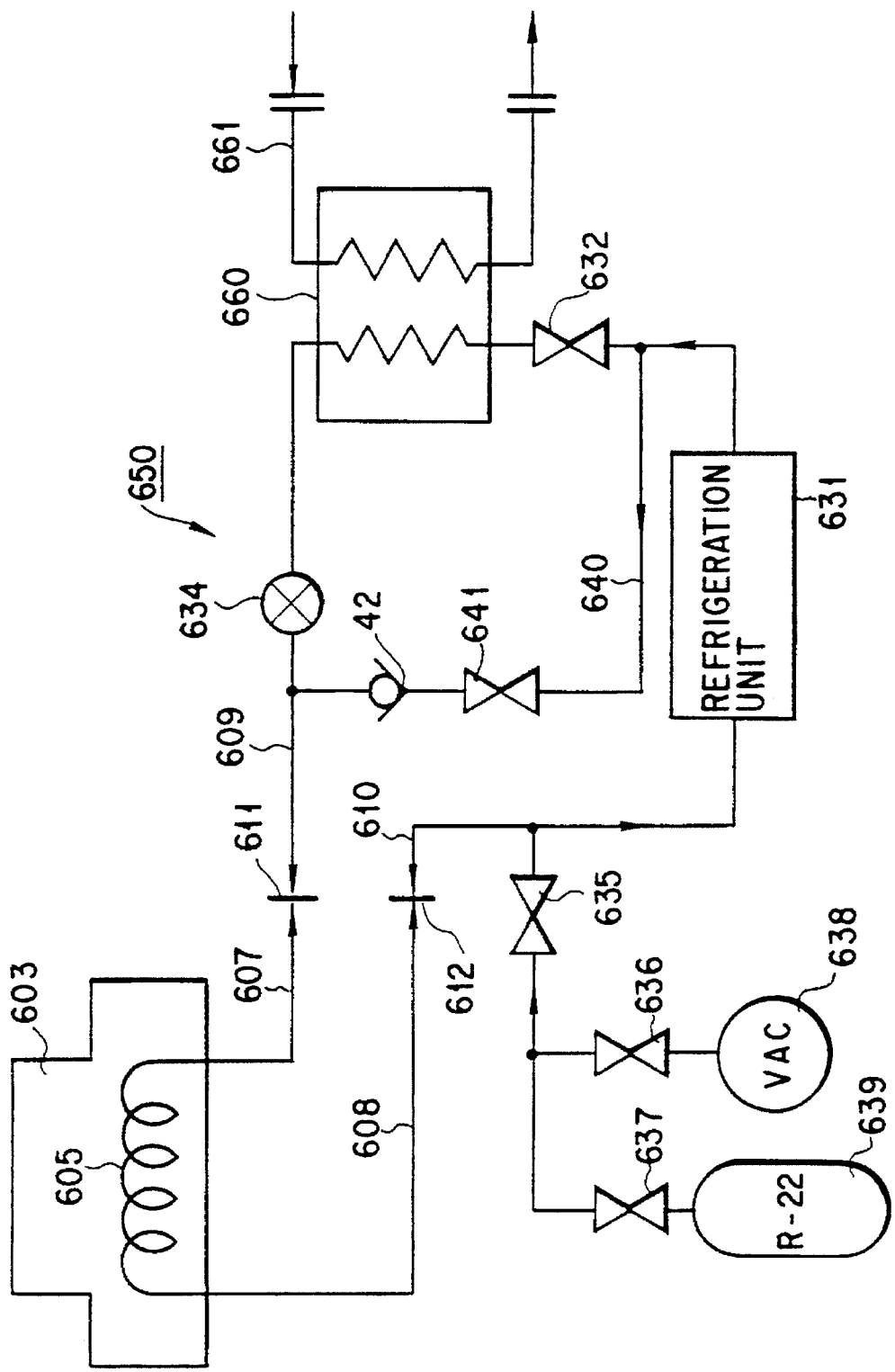
FIG. 36 is a block sectional view showing an electrostatic chuck having a cooling means according to still another embodiment.

A cooling system 650 according to another embodiment will be described next with reference to FIG. 36. Note that a description of a portion, of the cooling system 650, which is common to the above cooling system 630 will be omitted.

In this cooling system 650, a bypass 640 is arranged on the downstream side of a refrigeration unit 631 so that a refrigerant is supplied to a susceptor internal flow path 605 via the bypass 640 without the mediacy of a condenser 660 and an expansion valve 634. The bypass 640 has a valve 641 and a check valve 642 and communicates with the downstream side of the expansion valve 634.

According to this cooling system 650, by directly supplying a high-temperature refrigerant from the refrigeration unit 631 to the susceptor internal flow path 605 via the bypass 640, the temperature of a susceptor 603 can be increased, and the interior of the refrigerant circulation system can be defrosted.

A cooling system 670 according to still another embodiment will be described next with reference to FIG. 37.

In this cooling system 670, a plurality of refrigeration circuits are arranged at a plurality of stages. More specifically, a first-stage refrigeration circuit, a second-stage refrigeration circuit, and a third-stage refrigeration circuit are connected in series. The first-stage refrigeration circuit is constituted by a first refrigeration unit 651, a first condenser 652, and a first expansion valve 653. The second-stage refrigeration circuit is constituted by a second refrigeration unit 654, a second condenser 655, and a second expansion valve 656. The third-stage refrigeration circuit is constituted by a third refrigeration unit 631, a third condenser 660, and a third expansion valve 634.

In this cooling system 670, first of all, a refrigerant (R22) evaporates at −40° C. in the first-stage refrigeration circuit to cool the condenser 655 of the second-stage refrigeration circuit. The condensed refrigerant (R23) in the second-stage refrigeration circuit evaporates at −80° C. to cool the condenser 660 of the third-stage refrigeration circuit. The condensed refrigerant (R14) in the third-stage refrigeration circuit evaporates at −120° C. to cool the susceptor 603. Since cooling is performed stepwise from a refrigerant having a high boiling point to a refrigerant having a low boiling point in this manner, a refrigerant supplied to the susceptor can be smoothly and quickly cooled to an ultra-low-temperature range.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electrostatic chuck attached to a susceptor assembly constituted by a combination of a plurality of susceptor members, for chucking/holding an object to be processed with an electrostatic attractive force, comprising:

a conductive film;

an insulating coat stuck on a surface of said susceptor assembly to cover said conductive film;

a feeder circuit for applying a voltage to said conductive film to cause said insulating coat to generate an electrostatic attractive force, said feeder circuit including a connecting conductor replacing a portion of said insulating coat to be electrically connected to said conductive film, a first metallic feeder pin extending through said susceptor assembly from a front surface side to a rear surface side thereof and having one end portion electrically connected to said connecting conductor, an insulating member for insulating said first metallic feeder pin from said susceptor assembly, an adhesive member for bonding/fixing said insulating member to said first metallic feeder pin and said susceptor assembly, a second metallic feeder pin having one end portion pressed against the other end portion of said first metallic feeder pin to be electrically connected to said first metallic feeder pin, and a power supply electrically connected to said second metallic feeder pin, said insulating member and said adhesive member each consisting of polybenzimidazole whose average molecular weight is in a range of 2,000 to 100,000.

2. A chuck according to claim 1, wherein a thickness of said adhesive member between said first feeder pin and said insulating member is not more than 0.1 mm, and a thickness of said adhesive member between said insulating member and said susceptor is also not more than 0.1 mm.

3. A chuck according to claim 1, wherein a solvent for preparing a polybenzimidazole solution is at least one solvent selected from the group of consisting of N,N-dimethylacetamide, N,N-dimethylformamide, dimethylsulfoxide, and N-methyl-2-pyrrolidone.

4. A chuck according to claim 3, wherein the solvent is N,N-dimethylacetamide having a boiling point of 167° C.

5. A chuck according to claim 1, wherein one end portion of said first feeder pin is smaller in diameter than the other end portion, and the small-diameter end portion is in contact with said connecting conductor.

6. A chuck according to claim 1, wherein both said first and second feeder pins consist of aluminum or an aluminum alloy, and both said insulating member and said adhesive member consist of polybenzimidazole.

7. A chuck according to claim 1, wherein a thickness of said insulating member is not less than 1 mm.

8. A chuck according to claim 1, wherein said susceptor is constituted by a plurality of susceptor members, and said plurality of susceptor members can be separated from each other at said insulating member when said insulating coat is removed from said susceptor.

9. A chuck according to claim 1, wherein said susceptor comprises an aluminum member having a surface, which is in contact with said insulating coat, anodized and polished until a centerline average roughness Ra becomes 0.1a to 0.5a.

* * * * *